United States Patent
Yedinak et al.

(10) Patent No.: US 6,831,329 B2
(45) Date of Patent: Dec. 14, 2004

(54) QUICK PUNCH THROUGH IGBT HAVING GATE-CONTROLLABLE DI/DT AND REDUCED EMI DURING INDUCTIVE TURN OFF

(75) Inventors: Joseph A. Yedinak, Mountaintop, PA (US); Jon Gladish, Forty Fort, PA (US); Sampat Shekhawat, Mountaintop, PA (US); Gary M. Dolny, Mountaintop, PA (US); Praveen Muraleedharan Shenoy, Wilkes-Barre, PA (US); Douglas Joseph Lange, Mountaintop, PA (US); Mark L. Rinehimer, Forty Fort, PA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/278,224

(22) Filed: Oct. 22, 2002

(65) Prior Publication Data

US 2003/0080377 A1 May 1, 2003

Related U.S. Application Data

(60) Provisional application No. 60/339,447, filed on Oct. 26, 2001.

(51) Int. Cl.[7] ............................................. H01L 21/336
(52) U.S. Cl. ...................... 257/328; 257/329; 257/330; 257/331; 257/332; 438/212; 438/268; 438/267; 438/213
(58) Field of Search .................................. 257/328, 325, 257/337, 341, 336, 343, 347

(56) References Cited

U.S. PATENT DOCUMENTS

| | | | | |
|---|---|---|---|---|
| 5,346,835 A | * | 9/1994 | Malhi et al. ................. | 438/200 |
| 5,510,634 A | | 4/1996 | Okabe et al. | |
| 5,932,897 A | * | 8/1999 | Kawaguchi et al. ......... | 257/141 |
| 6,208,185 B1 | * | 3/2001 | John et al. ................... | 327/170 |
| 6,242,787 B1 | * | 6/2001 | Nakayama et al. .......... | 257/493 |
| 6,259,136 B1 | * | 7/2001 | Kawaguchi et al. ......... | 257/336 |
| 6,482,681 B1 | * | 11/2002 | Francis et al. ............... | 438/138 |
| 2002/0048855 A1 | * | 4/2002 | Matsudai et al. ............ | 438/135 |
| 2003/0042575 A1 | * | 3/2003 | Takahashi et al. ........... | 257/577 |

* cited by examiner

Primary Examiner—Minhloan Tran
Assistant Examiner—Fazli Erdem
(74) Attorney, Agent, or Firm—Thomas R. FitzGerald, Esq.; Laurence S. Roach, Esq.

(57) ABSTRACT

A quick punch-through integrated gate bipolar transistor (IGBT) includes a drift region and a gate. The drift region has a drift region dopant concentration and a drift region thickness. The gate has a gate capacitance. The drift region dopant concentration, drift region thickness and gate capacitance are adjusted dependent at least in part upon the PNP gain of the IGBT to maintain the potential difference between the gate and emitter at a level greater than the IGBT threshold voltage when the collector voltage reaches the bus voltage. This insures that the hole carrier concentration remains approximately equal to or greater than the drift region dopant concentration when the depletion layer punches through to the buffer region during the turn-off delay. Thus, the collector voltage overshoot and the rate of change of voltage and current are controlled, and electromagnetic interference is reduced, during turn off.

26 Claims, 20 Drawing Sheets

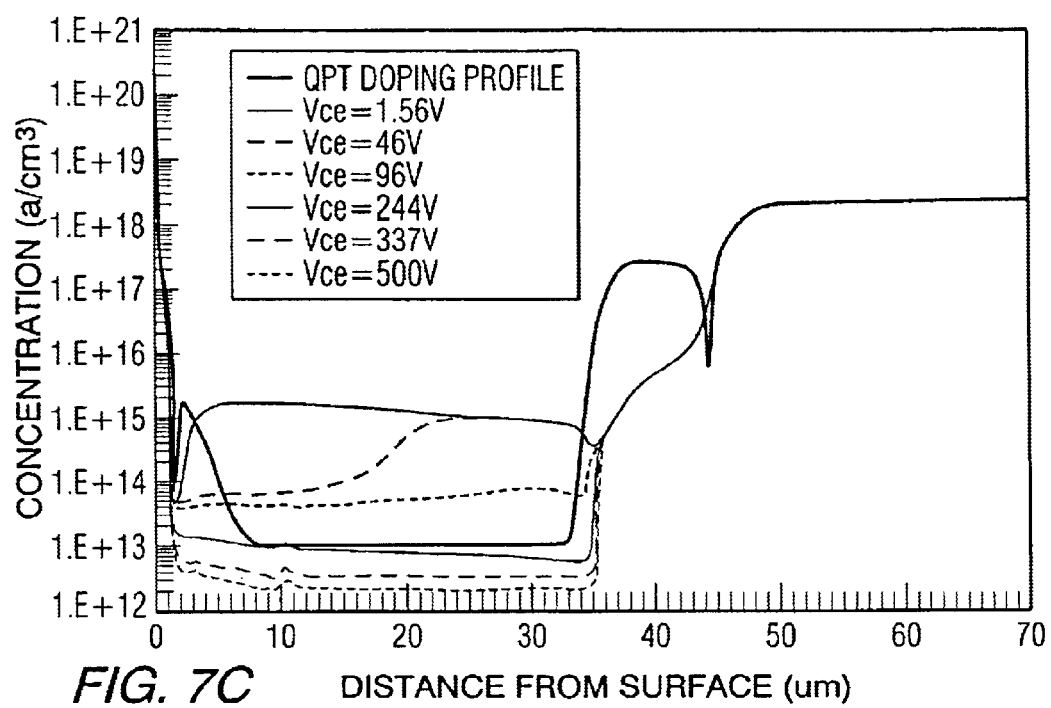
FIG. 7C DISTANCE FROM SURFACE (um)

US 6,831,329 B2

QUICK PUNCH THROUGH IGBT HAVING GATE-CONTROLLABLE DI/DT AND REDUCED EMI DURING INDUCTIVE TURN OFF

CROSS REFERENCE TO RELATED APPLICATIONS

This application claims the benefit of U.S. Provisional Patent Application Ser. No. 60/339,447, filed Oct. 26, 2001.

FIELD OF THE INVENTION

The present invention relates generally to Integrated Gate Bipolar Transistors (IGBTs) and, more particularly, to quick punch through IGBTs.

DESCRIPTION OF THE RELATED ART

IGBTs can be constructed in a variety of cell configurations, such as, for example closed cell geometries and trench stripe cells. For simplicity, the structure of a typical IGBT is hereinafter discussed with reference to a stripe cell configuration IGBT. Referring to FIG. 1, an IGBT 10 having a stripe cell configuration is shown. Each cell of IGBT 10 includes epitaxial layer 12 in which two source stripes 14 and 16 are formed. The source stripes 14, 16 are surrounded within the epitaxial layer 12 by a base stripe 18. A portion of the base stripe 18 separates or lies between the source stripes, and is referred to as the body stripe 20.

The epitaxial layer 12 includes a lightly-doped drift region 22 that is disposed over a heavily doped buffer region 24. The heavily doped buffer region is disposed over a P-type collector region 25. Gate insulating stripes 26 and 28, typically of silicon dioxide, cover the top of epitaxial layer 12. Gate conductive stripes 30 and 32, typically of heavily doped polysilicon, cover insulating stripes 26 and 28, and form a gate electrode (not referenced). Gate conductive stripes 30 and 32 overlie corresponding channel stripes (not referenced) on opposite sides of the base stripe. Another insulating layer (not referenced) covers the gate stripes 30 and 32. A metal layer contacts the source stripes 14, 16 and body stripe 20. On the side of IGBT 10 that is opposite or underlying gate stripes 30 and 32, an emitter electrode 34 is formed.

IGBTs are widely used in switching applications, such as, for example, uninterruptible power supplies (UPS), switched mode power supplies, power factor correction circuits, and motor drive circuits. Accordingly, punch through (PT) IGBTs are typically designed with the goals of reducing electromagnetic interference (EMI) and reducing collector voltage overshoot. In order to reduce EMI and collector voltage overshoot, the punch through of the depletion region 22 into the buffer region 24 must be prevented at the bus or switching voltage used in the particular application. Preventing the punch through, in turn, is accomplished by manipulating the dopant concentration in and the thickness of drift region 22. What is referred to as "soft turn off" is only accomplished through this relatively complicated balancing of drift region thickness and dopant concentration. This balancing produces an PT IGBT that is optimized for a specific operating bus voltage and current density, rather than an IGBT that is capable of operating with relatively optimally reduced EMI and collector voltage overshoot across a range of operating parameters.

Even PT IGBTs that are optimized for a particular set of operating parameters have certain undesirable characteristics. For example, conventional IGBTs have a relatively large and undesirable collector voltage overshoot at punch through. Further, the gate voltage (Vg) of a conventional IGBT may drop below zero volts at punch through, then recharge and undesirably turn the PT IGBT back on thereby delaying the turn off time of the PT IGBT. Moreover, conventional IGBTs have a current fall di/dt that is relatively large, substantially uncontrolled, independent of the gate resistance of the external drive circuit, and which contributes to an increased level of EMI.

Therefore, what is needed in the art is an IGBT that reduces EMI and collector voltage overshoot relative to a conventional PT IGBT.

Furthermore, what is needed in the art is an IGBT that reduces the need to perform the complicated balancing of the drift region thickness and dopant concentration in order to reduce EMI and collector voltage overshoot.

Still further, what is needed in the art is an IGBT that maintains the gate voltage at a level sufficient to prevent the IGBT from turning back on, thereby reducing the turn off delay time.

Moreover, what is needed in the art is an IGBT that controls the current fall di/dt at and following punch through.

SUMMARY OF THE INVENTION

The present invention provides a quick punch through integrated gate bipolar transistor (QPT IGBT).

The invention comprises, in one form thereof, a quick punch through IGBT having a drift region and a gate. The drift region has a drift region dopant concentration and a drift region thickness. The gate has a gate capacitance. The drift region dopant concentration, drift region thickness and gate capacitance are adjusted dependent at least in part upon the PNP gain of the IGBT to maintain the potential difference between the gate and emitter at a level greater than the IGBT threshold voltage when the collector voltage reaches the bus voltage. This insures that the hole carrier concentration remains approximately equal to or above the drift region dopant concentration when the depletion layer punches through to the buffer region during the turn-off delay. Thus, the collector voltage overshoot and the rate of change of voltage and current are controlled, and electromagnetic interference is reduced, during turn off.

An advantage of the present invention is turn-off delay time is reduced relative to a conventional PT IGBT.

Another advantage of the present invention is that collector voltage overshoot is substantially reduced relative to the overshoot in a conventional PT IGBT, alleviating the need for snubber circuits.

A further advantage of the present invention is that the rate of change of IGBT current during turn off is reduced, thereby reducing electromagnetic interference.

A still further advantage of the present invention is that turn-off losses are reduced with decreasing bus voltages.

BRIEF DESCRIPTION OF THE DRAWINGS

The above-mentioned and other features and advantages of this invention, and the manner of attaining them, will become apparent and be better understood by reference to the following description of one embodiment of the invention in conjunction with the accompanying drawings, wherein:

FIGS. 7A, 7B and 7C are plots of the simulated doping and carrier concentration for the QPT IGBT of the present invention;

Corresponding reference characters indicate corresponding parts throughout the several views. The exemplifications set out herein illustrate one preferred embodiment of the invention, in one form, and such exemplifications are not to be construed as limiting the scope of the invention in any manner.

DETAILED DESCRIPTION OF THE DRAWINGS

Figure 1:
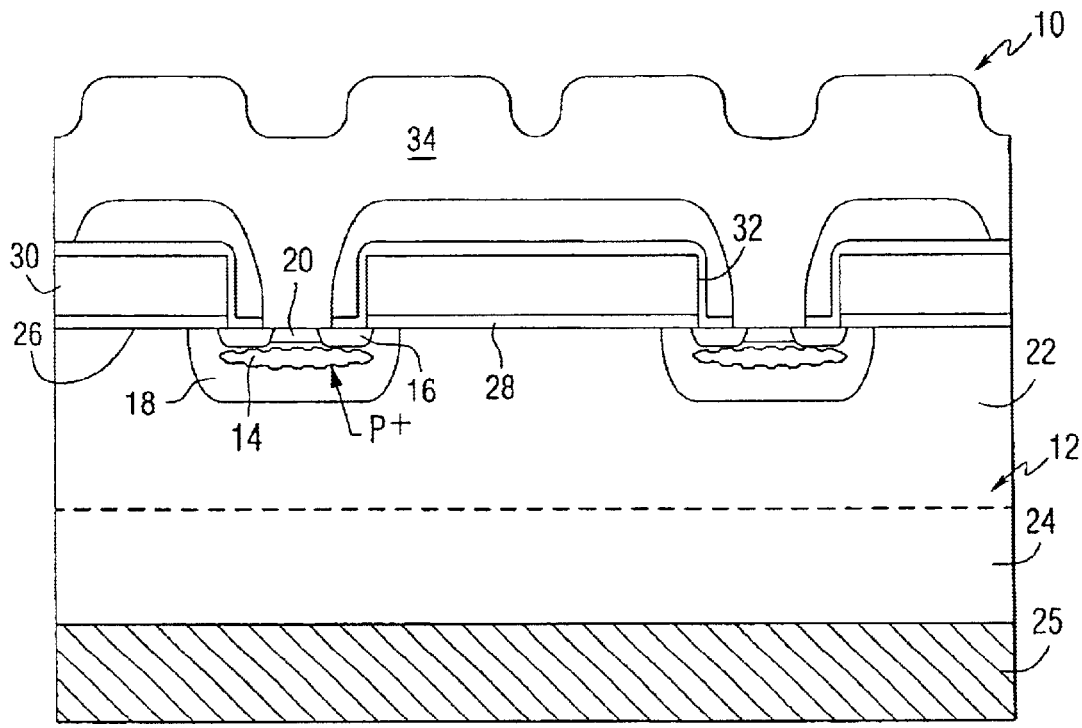
FIG. 1 is a cross-sectional view of a typical stripe cell IGBT.
Figure 2:
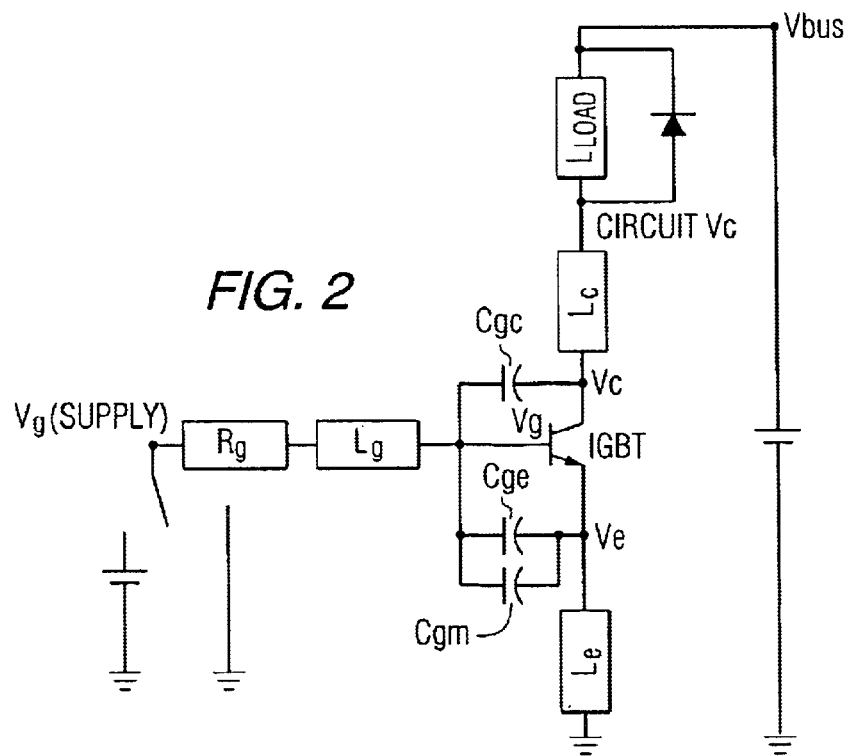
FIG. 2 is a hard switched inductive test circuit for an IGBT showing a simplified IGBT equivalent circuit.

A simplified equivalent circuit of IGBT 10 is shown in FIG. 2 as part of a switching circuit 40. Circuit 40 includes free-wheeling IGBT diode 42, load inductance 44, and parasitic gate, emitter and collector inductances, Lg, Le, and Lc, respectively. Vg(supply) is the voltage applied to the gate terminal of the IGBT 10, whereas Vg is the voltage applied to the gate of IGBT 10 after the affects of the gate resistance Rg and gate inductance Lg are considered, Vc is the voltage applied to the collector of IGBT 10, whereas $VC_{(CIRCUIT)}$ is the collector voltage after the affects of Lc is considered, and Ve is the voltage present at the emitter of IGBT 10. Bus voltage Vbus is the voltage applied from the external IGBT collector across capacitor C1 to ground.

Figure 3A:
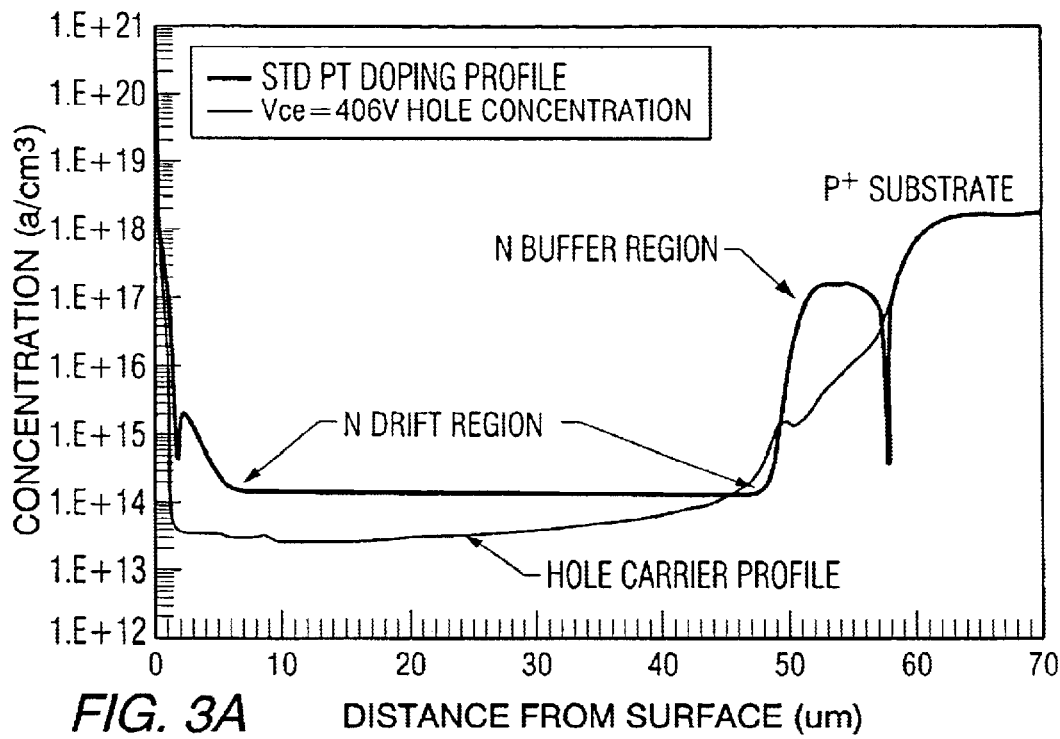
FIG. 3A is a doping carrier concentration profile for a conventional 600 Volt PT IGBT.

Referring now to FIG. 3A, a doping profile and hole carrier profile of a conventional 600V PT IGBT having a 0.1 cm³ active area and which is optimized for being switched at 12 Amperes (A) and 390V is shown. The IGBT has an on-state voltage drop of 2V at 25E Celsius (C) and 1.7V at 125EC with 15V applied to the IGBT gate. The plot of the doping profile shows that the N drift region is doped to a concentration of approximately $1.4 \times 10^{14}$, and begins at approximately 6.0 micrometers (um) from the surface of the IGBT die and extends into the die approximately 50 um. The N buffer region is doped to a concentration of approximately $2.5 \times 10^{17}$, and extends from a depth of approximately 50 um to approximately 58 um where the P+ substrate having a dopant concentration of approximately $3.0 \text{ H } 10^{18}$ begins. The plot of the hole carrier profile shows the hole concentration to be from approximately $1.0 \times 10^{13}$ at a depth of approximately 2 um (i.e., approximately the depth at which the N drift region begins) to approximately $1.0 \times 10^{14}$, at a depth of approximately 50 um (i.e., approximately the depth at which the N drift region ends and the N buffer region begins).

The hole carrier concentration shown in FIG. 3A is plotted with a voltage differential between the collector and emitter (Vce) of approximately 406V, i.e., the punch through voltage of the IGBT, while the voltage is rising during a 125EC, 12A, 500V hard turn off. The hole carrier concentration increases in a generally linear fashion from a concentration of $1.0 \times 10^{14}$ at a depth of 50 um to a concentration of approximately $1.0 \times 10^{18}$ at a depth of approximately 58 um (i.e., the depth at which the P+ substrate begins).

Figure 3B:
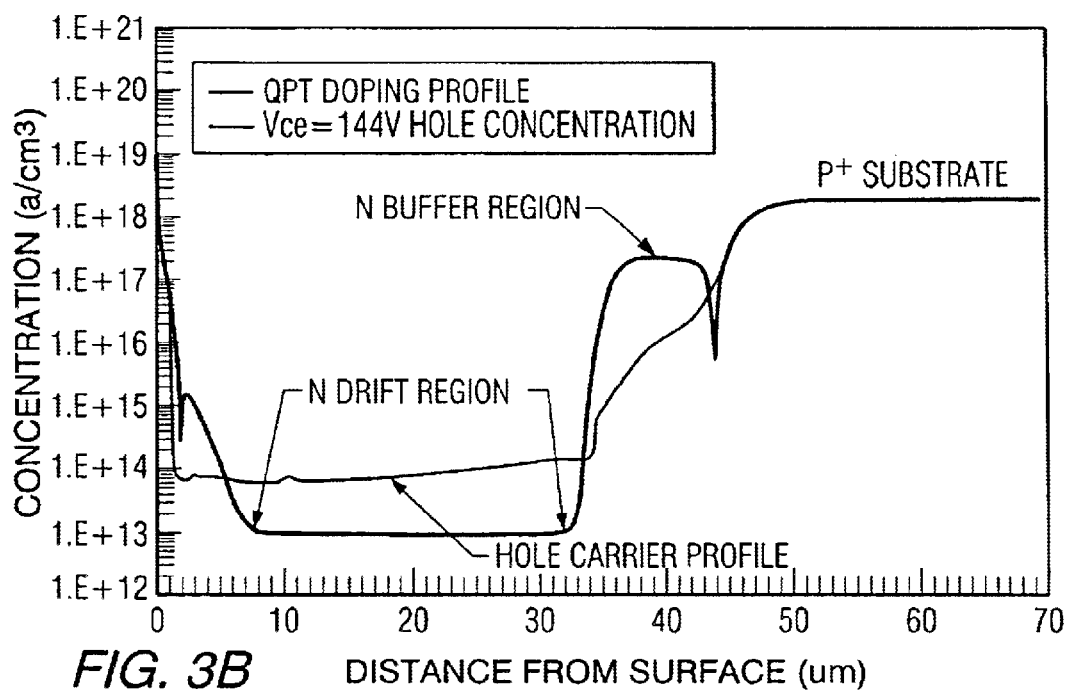
FIG. 3B is a doping carrier concentration profile for one embodiment of a 600 Volt QPT IGBT of the present invention.

Referring now to FIG. 3B, a doping profile and hole carrier profile of one embodiment of an Quick Punch Through (QPT) IGBT of the present invention is shown. The QPT IGBT of the present invention is, like the conventional PT IGBT depicted in FIG. 3A, also a 600V IGBT having a 0.1 cm³ active area and is optimized for being switched at 12 Amperes (A) and 390V. The QPT IGBT, also like the conventional PT IGBT, has an on-state voltage drop of 2V at 25E Celsius (C) and 1.7V at 125EC with 15V applied to the QPT IGBT gate. The QPT IGBT is similar to the conventional IGBT in that the plot of the doping profile shows that the N drift region of the QPT IGBT also begins at approximately 6.0 micrometers (um) from the surface of the IGBT die.

However, unlike the conventional PT IGBT which has an N drift region that extends into the die to a depth of approximately 50 um, the N drift region of the QPT IGBT extends into the die to a depth of only approximately 33 um. Further, the dopant concentration of the QPT IGBT is much lower, i.e., approximately $1.0 \times 10^{13}$, than the dopant concentration of the conventional PT IGBT (i.e., approximately $1.4 \times 10^{14}$). The N buffer region of the QPT IGBT starts at a much shallower depth, i.e., at approximately 34 um, than does the N buffer region of the conventional PT IGBT, extends to a depth of approximately 44 um, and has approximately the same dopant concentration as the conventional PT IGBT.

FIG. 3B also shows the plot of the hole carrier profile for the QPT IGBT. The hole concentration is from approximately $1.0 \times 10^{14}$ at a depth of approximately 2 um (i.e., approximately the depth at which the N drift region begins) and stays relatively constant up until a depth of approximately 33 um (i.e., approximately the depth at which the N drift region ends and the N buffer region begins). The hole carrier concentration is plotted with a voltage differential between the collector and emitter (Vce) of approximately 144V, i.e., the punch through voltage of the QPT IGBT, while the voltage is rising during a 125EC, 12A, 500V hard turn off. The hole carrier concentration increases in a generally linear fashion from a concentration of $1.0 \times 10^{14}$ at a depth of approximately 33 um to a concentration of approximately $1.0 \times 10^{18}$ at a depth of approximately 50 um (i.e., the depth at which the P+ substrate begins).

Thus, in summary, the N drift region of the QPT IGBT of the present invention is shallower and more lightly doped than the N drift region of a conventional PT IGBT. Further, the N buffer region of the QPT IGBT begins at a shallower depth than does the N buffer region of the conventional PT IGBT. It should be particularly noted that in the conventional PT IGBT the concentration of hole carriers is lower than the N drift region dopant concentration, and that the edge of the depletion region is designed to prevent punch through to the buffer region at the bus voltage being switched. Conversely, the hole concentration in the QPT IGBT is approximately equal to or greater than the dopant concentration in the N drift region and remains so while the collector voltage is rising to the punch through voltage (see FIGS. 7A–7C).

Figure 4A:
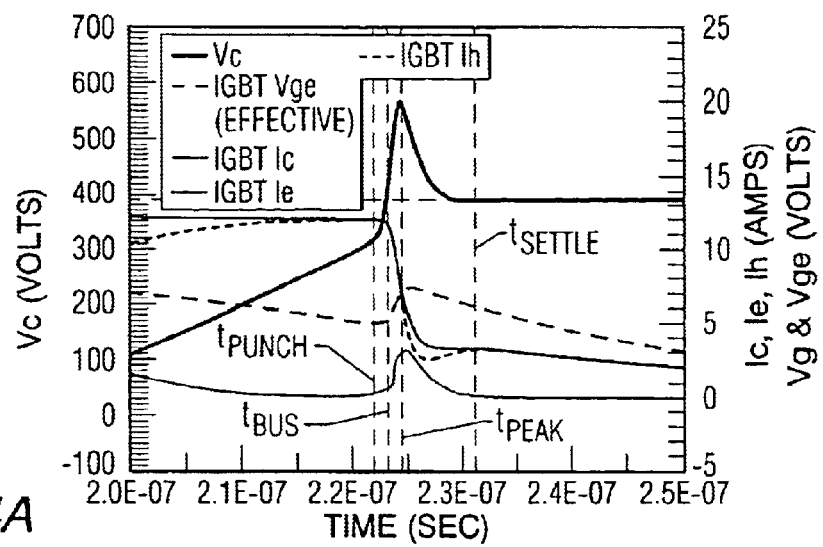
FIGS. 4A, 4B and 4C are plots of a simulated hard turn-off switching waveforms for a conventional 600 Volt PT IGBT.
Figure 4B:
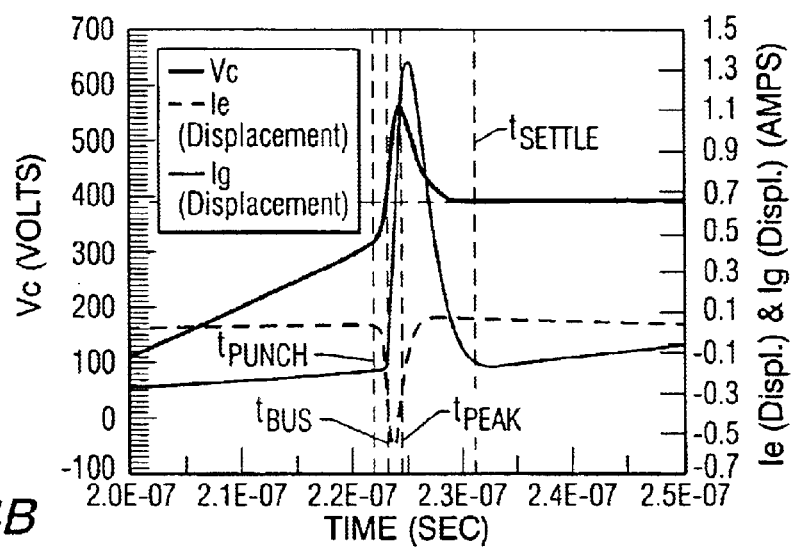
Figure 4C:
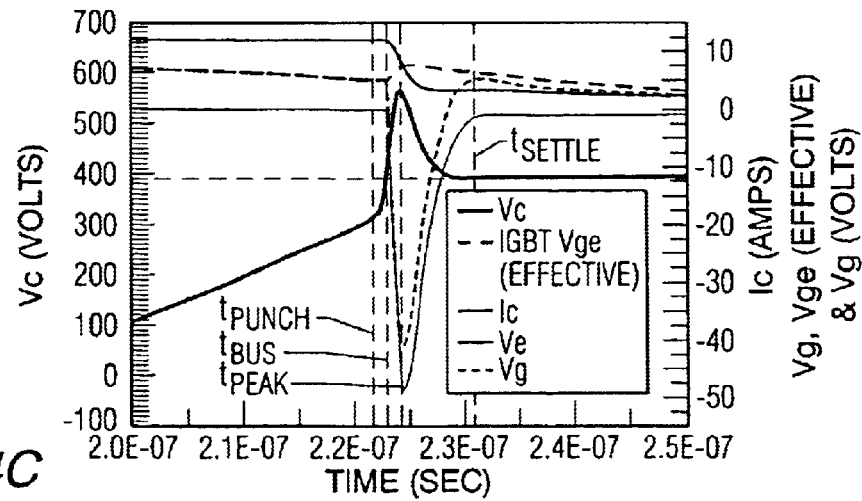

Referring now to FIGS. 4A, 4B and 4C, simulated hard turn-off switching waveforms for a conventional 600 Volt PT IGBT operating at a junction temperature of 125EC, a switching current density of 120A/cm$^2$, 390V bus voltage, 15V gate supply voltage (Vg$_{(SUPPLY)}$), 25 ohm gate resistance (Rg) and having a threshold voltage V$_{TH}$ of approximately 5V are shown. As best shown in FIG. 4A, the depletion layer punches through to the buffer layer at time t$_{PUNCH}$. Vc reaches the bus voltage V$_{BUS}$ of 390V at time t$_{BUS}$, then overshoots the level of V$_{BUS}$ by approximately 150V at time t$_{PEAK}$, and settles back down to the level of V$_{BUS}$ at time t$_{SETTLE}$.

Prior to the time t$_{PUNCH}$ at which punch through occurs, the collector voltage Vc of the conventional PT IGBT increases toward bus voltage V$_{BUS}$ in a generally linear manner. Punch through occurs when Vc reaches a level of approximately fifty-percent of the rated PT IGBT voltage. At punch through, the collector voltage Vc undergoes a relatively steep positive rate of change dv/dt. As best shown in FIGS. 4B and 4C, this steep positive dv/dt of Vc generates a displacement current Ie$_{(DISP)}$ and Ig$_{(DISP)}$ that flows between time t$_{PUNCH}$ and time t$_{BUS}$. Displacement current Ig$_{(DISP)}$ flows through the gate to collector and gate to emitter capacitances, i.e., Cgc and Cge, respectively, and Ie$_{(DISP)}$ flows through the gate to emitter metal capacitance Cgm. The flow of these displacement currents through the corresponding capacitances results in the effective gate voltage Vge$_{(EFFECTIVE)}$ (i.e., the potential difference of Vg minus Ve) falling below the threshold voltage V$_{TH}$ of the conventional PT IGBT during the time interval of t$_{PUNCH}$ to time t$_{BUS}$ for a period of time that is sufficient to cause Ie to fall to zero and the hole carrier concentration to fall below the N-drift doping concentration between t$_{PUNCH}$ and t$_{PEAK}$.

At time t$_{BUS}$ the collector current Ic rate of change di/dt of the conventional PT IGBT becomes negative. This negative di/dt flows through Le, i.e., the inductance in series with the conventional PT IGBT emitter, and thereby causes the emitter voltage level Ve to fall below ground potential as shown in FIG. 4C and given by the formula Ve=Le(di/dt). Gate voltage Vg is capacitively coupled to Ve by Cge, and lags Ve by a small time delay due to Le, Lg and Cge. This time delay and the continued dv/dt of collector voltage Vc above Vbus occurring between times t$_{BUS}$ and t$_{PEAK}$ results in Vge$_{(EFFECTIVE)}$ exceeding V$_{TH}$, thereby undesirably re-biasing to an on state the conventional PT IGBT between times t$_{BUS}$ and t$_{PEAK}$.

At time t$_{PEAK}$, the depletion layer of the conventional PT IGBT has spread enough to support the bus/switching voltage. No emitter current Ie drifts across the channel and hole injection from the IGBT collector ceases. The collector current Ic di/dt abruptly drops to a rate controlled by the recombination of minority carriers in the remaining un-depleted N drift and buffer layers. The abrupt dv/dt can cause some conventional PT IGBTs to be re-biased on between times t$_{BUS}$ and t$_{PEAK}$, as is best shown in FIG. 4A by the peak in electron current Ie shortly following time t$_{PEAK}$. Between times t$_{BUS}$ and t$_{PEAK}$ the rate of change of Ic is not controlled by the discharging of Vge$_{(EFFECTIVE)}$ below V$_{TH}$, i.e., a portion of the Ic is due to minority carrier recombination that takes place in the N buffer. The turn-off of the conventional PT IGBT is delayed by the gate having to re-discharge below V$_{TH}$, causing an increase in the current fall time and in turn-off energy loss. The di/dt beyond time t$_{SETTLE}$ is controlled by minority carrier recombination of the carriers in the buffer region/layer.

Figure 5A:
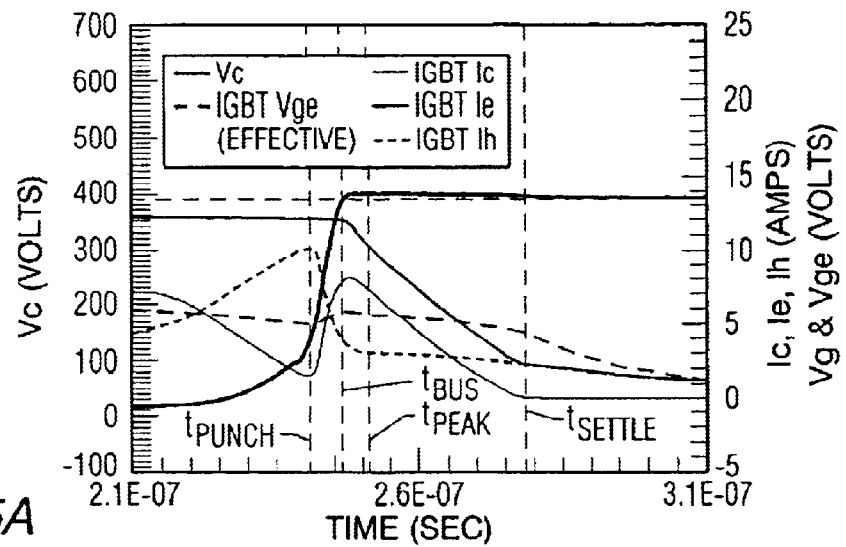
FIGS. 5A, 5B and 5C are plots of a simulated hard turn-off switching waveforms for the QPT IGBT of the present invention.
Figure 5B:
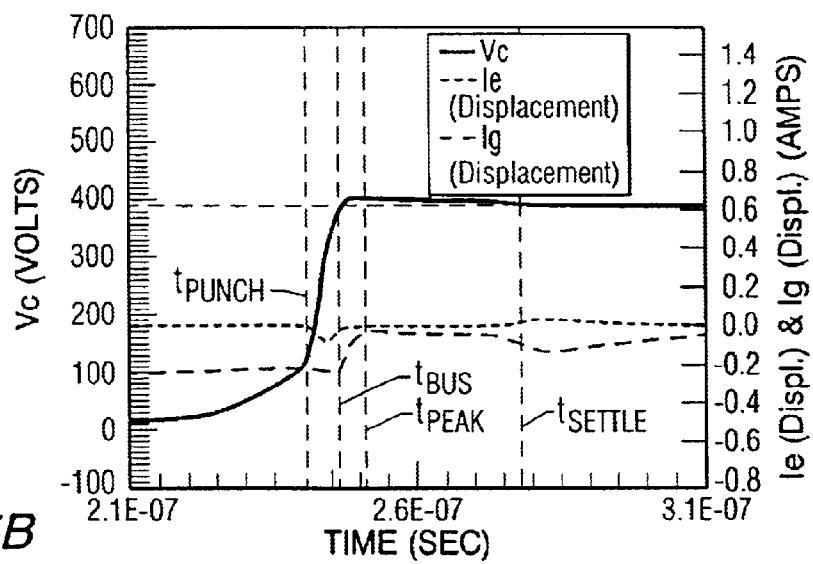
Figure 5C:
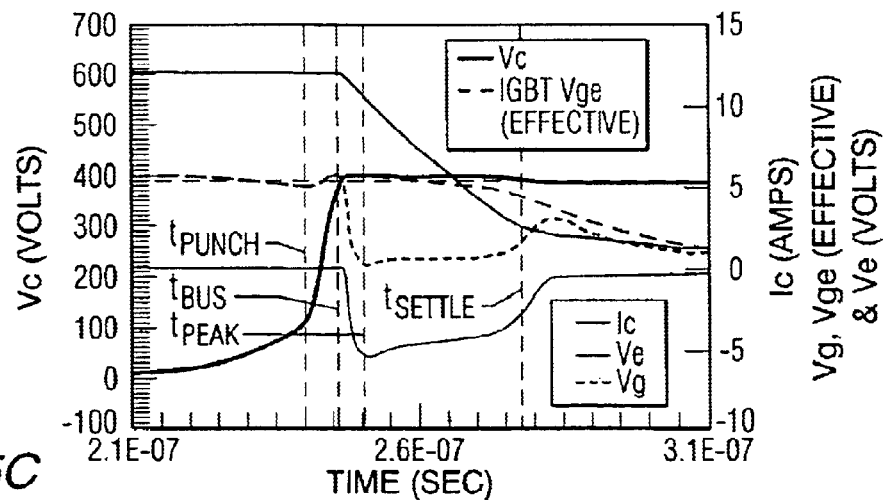

In contrast to the conventional PT IGBT, the QPT IGBT of the present invention reduces the turn-off delay time and reduces turn-off energy losses. Referring now to FIGS. 5A, 5B and 5C, simulated hard turn-off switching waveforms for a quick punch through (QPT) IGBT of the present invention are shown. The QPT IGBT is a 600 Volt QPT IGBT operating at a junction temperature of 125EC, switching current density of 120A/cm$^2$, 390V bus voltage, 15V gate supply voltage, 25 ohm gate resistance, and having a threshold voltage V$_{TH}$ of approximately 3V. Similar to the conventional PT IGBT, and as best shown in FIG. 5A, the QPT IGBT depletion layer punches through to the buffer layer at time t$_{PUNCH}$, and Vc reaches the bus voltage V$_{BUS}$ of 390V at time t$_{BUS}$. Unlike the conventional PT IGBT, however, Vc only minimally overshoots (i.e., by approximately ten to twenty volts) the level of V$_{BUS}$. At time t$_{PEAK}$, Vc is at or above V$_{BUS}$, and the collector current Ic of the QPT IGBT begins to decline from its pre-punch through level in a generally linear manner.

Prior to the time t$_{PUNCH}$ at which punch through occurs, the collector voltage Vc of the QPT IGBT of the present invention increases gradually toward bus voltage V$_{BUS}$. Punch through occurs when Vc reaches a level of less than approximately one-third of the rated QPT IGBT voltage. At punch through, the collector voltage Vc undergoes a steep positive rate of change dv/dt and increases in a generally exponential manner toward V$_{BUS}$. As best shown in FIGS. 5B and 5C, this steep positive dv/dt of Vc generates displacement currents Ie$_{(DISP)}$ and Ig$_{(DISP)}$ that flow between time t$_{PUNCH}$ and time t$_{BUS}$ (see FIG. 5B). Displacement current Ig$_{(DISP)}$ flows through the gate to collector and gate to emitter capacitances, i.e., Cgc and Cge, respectively, and Ie$_{(DISP)}$ flows through the gate to emitter metal capacitance Cgm.

As shown in FIG. 5A, unlike the conventional PT IGBT in which Vge$_{(EFFECTIVE)}$ falls below the threshold voltage V$_{TH}$, (FIG. 4A) between time t$_{PUNCH}$ and time t$_{BUS}$, Vge$_{(EFFECTIVE)}$ of the QPT IGBT remains above threshold voltage V$_{TH}$, or does not fall below V$_{TH}$ for a sufficient period of time, and thus the hole carrier concentration is prevented from falling below the N drift background doping concentration at the punch through voltage. This is due to the optimization of at least one or a combination of the capacitances, i.e., Cgc, Cge, and Cgm, of the QPT IGBT of the present invention being designed larger relative to the corresponding capacitances in a conventional PT IGBT, thereby ensuring that Vge$_{(EFFECTIVE)}$ does not fall below V$_{TH}$ for a period of time that is sufficient to allow the hole carrier concentration to fall below the N drift background doping concentration at the punch through voltage. Thus, the hole carrier concentration is maintained at approximately equal to or greater than the N drift background doping concentration at the punch through voltage. Ig$_{(DISP)}$ flows through the larger Cgc and Cge thereby charging or delaying the discharge of the gate capacitances which, in turn, maintains Vge$_{(EFFECTIVE)}$ above V$_{TH}$.

At time t$_{PUNCH}$ the collector current Ic di/dt becomes negative. However, unlike the conventional PT IGBT, the di/dt of the QPT IGBT of the present invention is controlled substantially entirely by the discharging of Vge$_{(EFFECTIVE)}$ during the time period $t_{BUS}$ to $t_{SETTLE}$. As is best shown in FIG. 5B, after time $t_{PUNCH}$ Ie continues to flow in a manner that generally parallels Ic and hole current IGBT Ih continues to be injected from the QPT IGBT collector.

It should be particularly noted that by maintaining Vge $_{(EFFECTIVE)}$ above $V_{TH}$, both peak load current and bus voltage exist simultaneously for a short period of time across the QPT IGBT collector to emitter terminals (see FIG. 5A).

It should be further particularly noted that although the turn-off losses and fall time increase slightly during the current fall in the QPT IGBT relative to a conventional PT IGBT, the reduced delay time and energy loss during the rise of collector voltage Vc offset that increase. Thus, lower turn off losses and reduced turn-off time are achieved with the QPT IGBT of the present invention. Similar to the conventional PT IBGT, the di/dt of Ic beyond time $t_{SETTLE}$ is controlled by minority carrier recombination in the buffer region/layer.

Figure 6A:
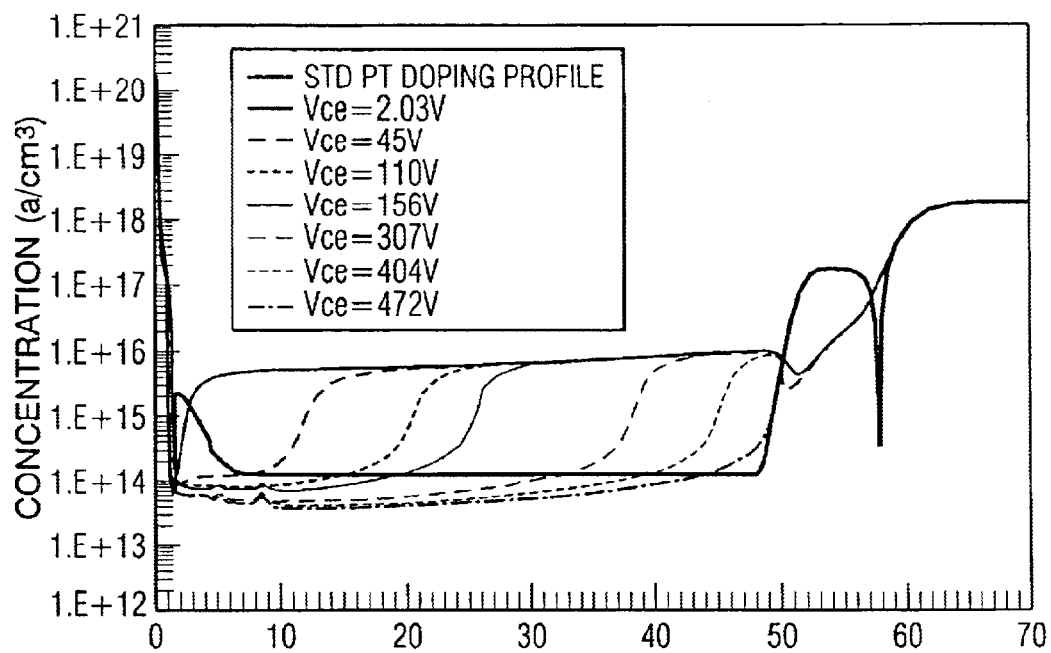
FIGS. 6A, 6B and 6C are plots of the simulated doping and carrier concentration for the conventional IGBT.
Figure 6B:
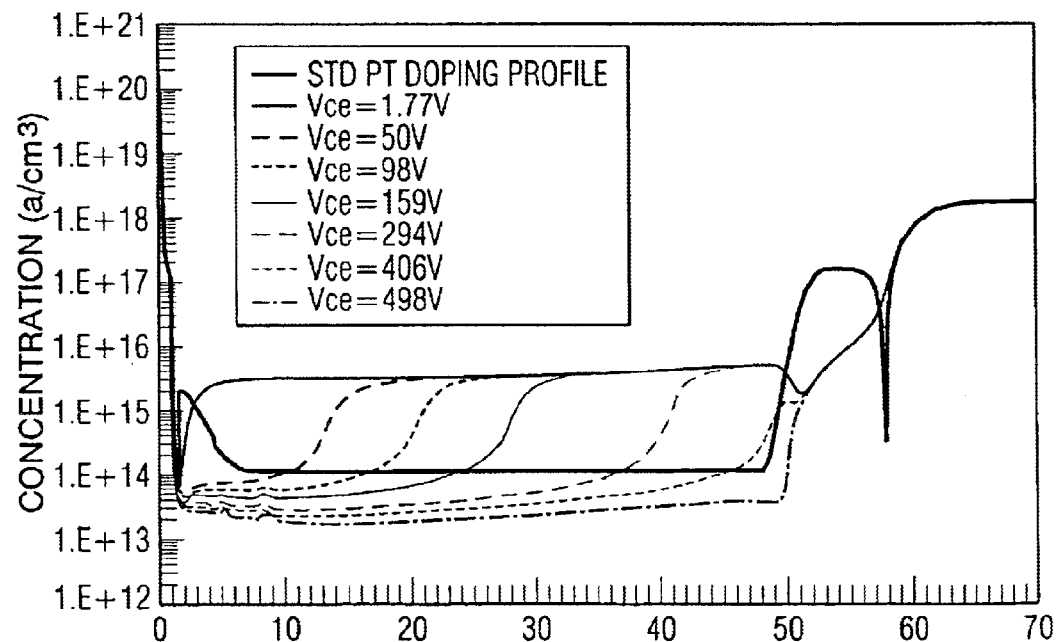
Figure 6C:
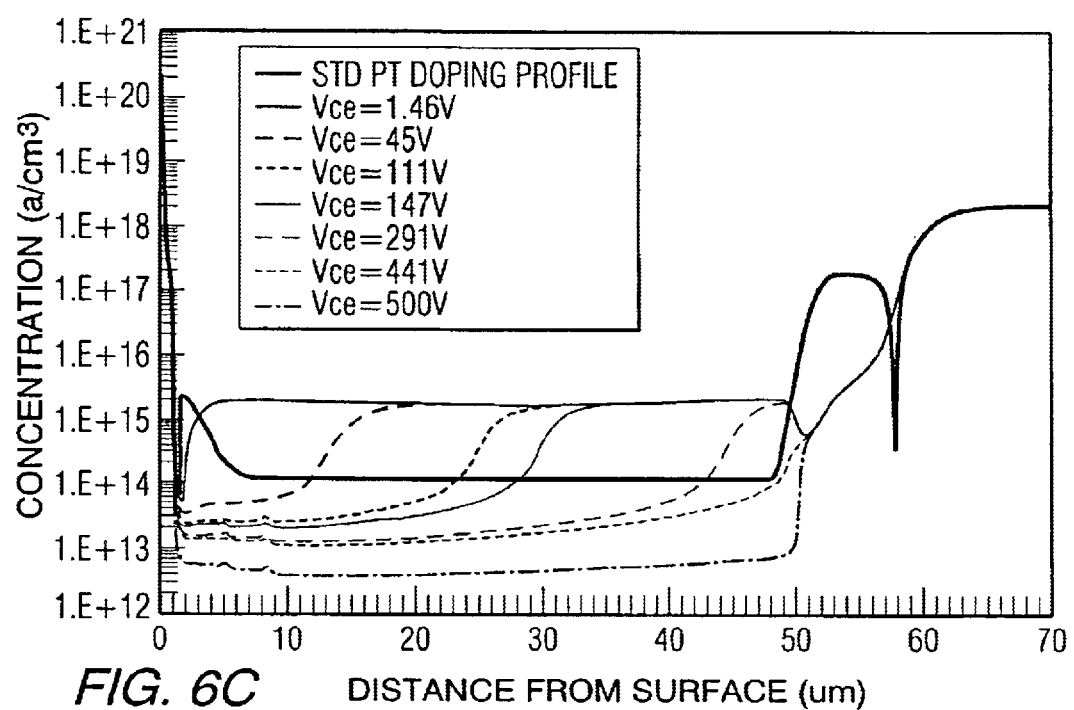

Referring now to FIGS. 6A, 6B and 6C, the simulated doping and carrier concentration profiles of a conventional PT IGBT having 0.10 cm$^2$ active area and an equivalent on-state voltage drop of 1.7V at a junction temperature of 125EC with a 15V gate supply voltage undergoing hard-switched inductive turn off at collector current densities 200, 120 and 50 A/cm$^2$, respectively, are shown. By comparing FIGS. 6A, 6B and 6C it is seen that during the inductive turn-off the distance by which the hole carriers have been swept out at a given collector to emitter voltage Vce decreases as current density increases. Further, the concentration of hole carriers at a given depth and at a given Vce increases with current density. These two factors combine to increase turn-off losses due to the higher Vce required to fully sweep the carriers out of the N drift region. Thus, when the Vc reaches the bus voltage there may be a region within the N drift layer that is not depleted of carriers. This un-depleted N drift region results in slower switching speeds and higher turn-off losses due to the higher carrier lifetimes in the N drift region.

Figure 7A:
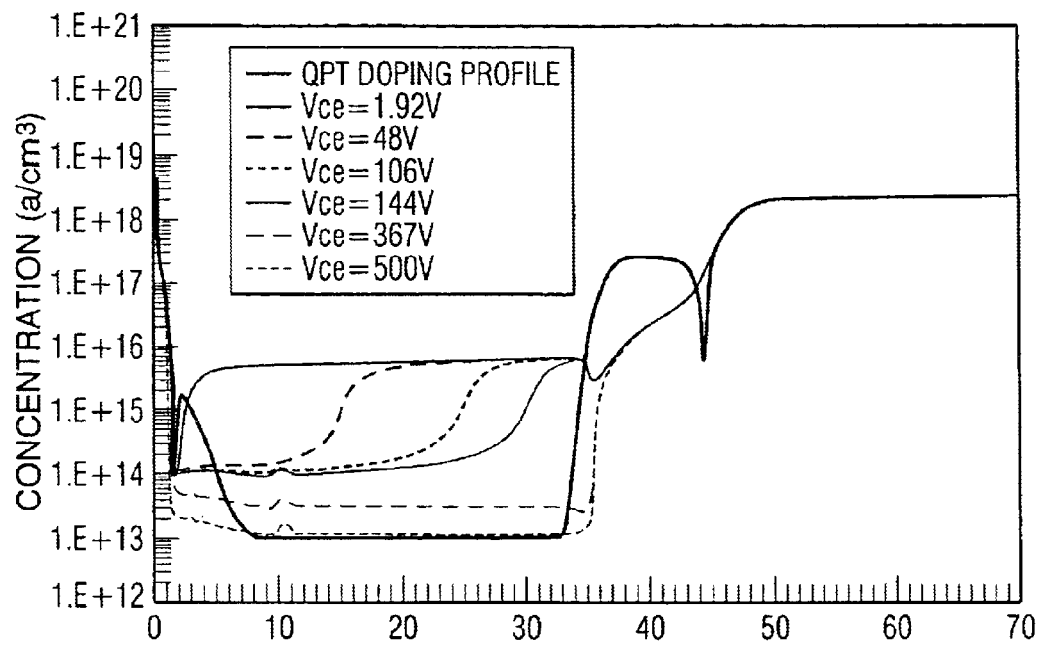
Figure 7B:
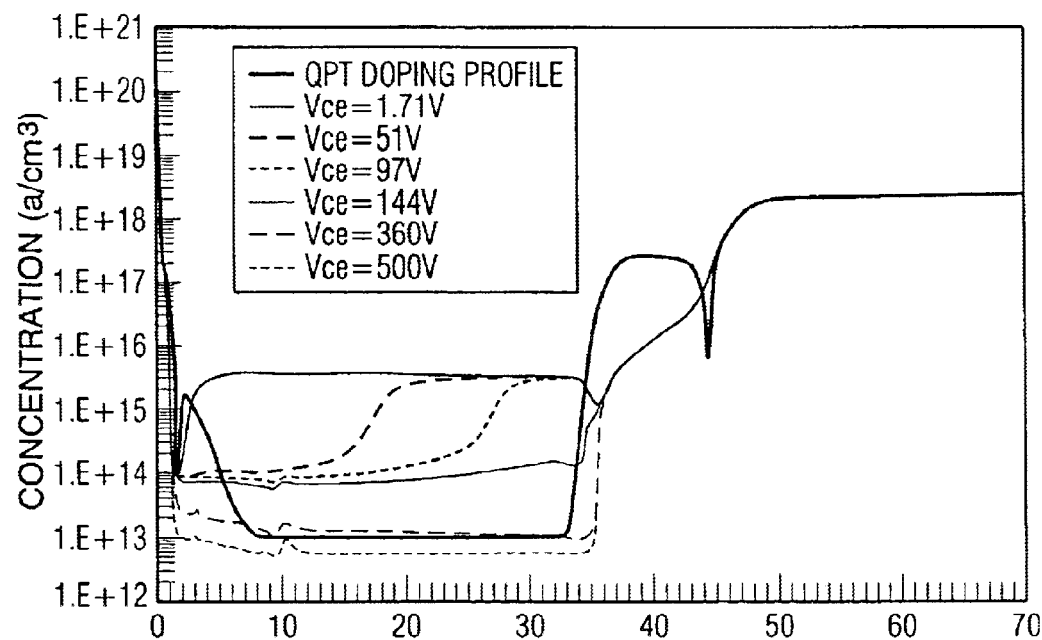

Conversely, and as shown in FIGS. 7A, 7B and 7C, the switching performance of the QPT IGBT of the present invention is substantially independent of bus or Vce voltage. FIGS. 7A, 7B and 7C show the simulated doping and carrier concentration profiles for the QPT IGBT of the present invention having 0.10 cm$^2$ active area and an equivalent on-state voltage drop of 1.7V at 125EC with a 15V gate supply voltage at 200 A/cm$^2$ during a hard-switched inductive turn off at current densities of 200, 120 and 50 A/cm$^2$, respectively. As stated above, the QPT IGBT of the present invention differs from a conventional PT IGBT in that hole current Ih continues to be injected from the QPT IGBT collector after time $t_{PUNCH}$. The continued injection of holes creates a hole carrier profile that is approximately equal to or greater than the N drift region doping level while the depletion layer is spreading toward the N buffer layer. As stated above, the punch through voltage of the QPT IGBT is less than approximately one-third the rated voltage, thereby reducing the dependency of turn-off losses on the PNP gain. The PNP gain controls the level of injected carriers, thereby controlling the initial rate of rise of the QPT IGBT collector voltage prior to punch through during the turnoff delay time. Furthermore, the turn-off loss variation that can result in a conventional PT IGBT form the un-depleted carriers in the N drift region are substantially reduced by the QPT IGBT of the present invention.

Figure 8A:
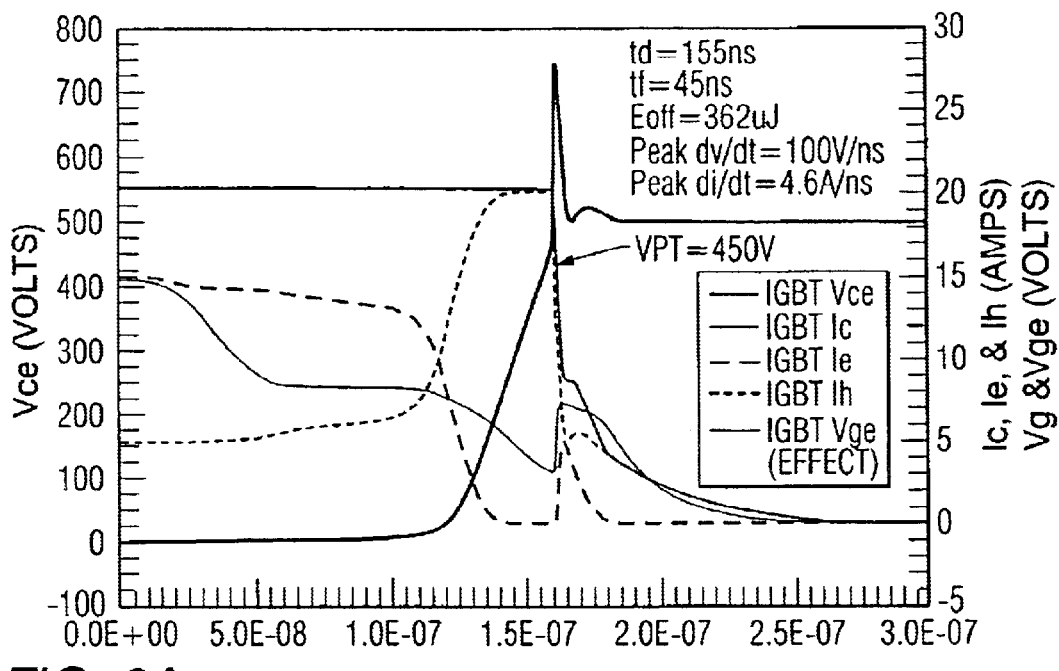
FIGS. 8A, 8B and 8C are simulated switching waveforms for a conventional 600V PT IGBT.
Figure 8B:
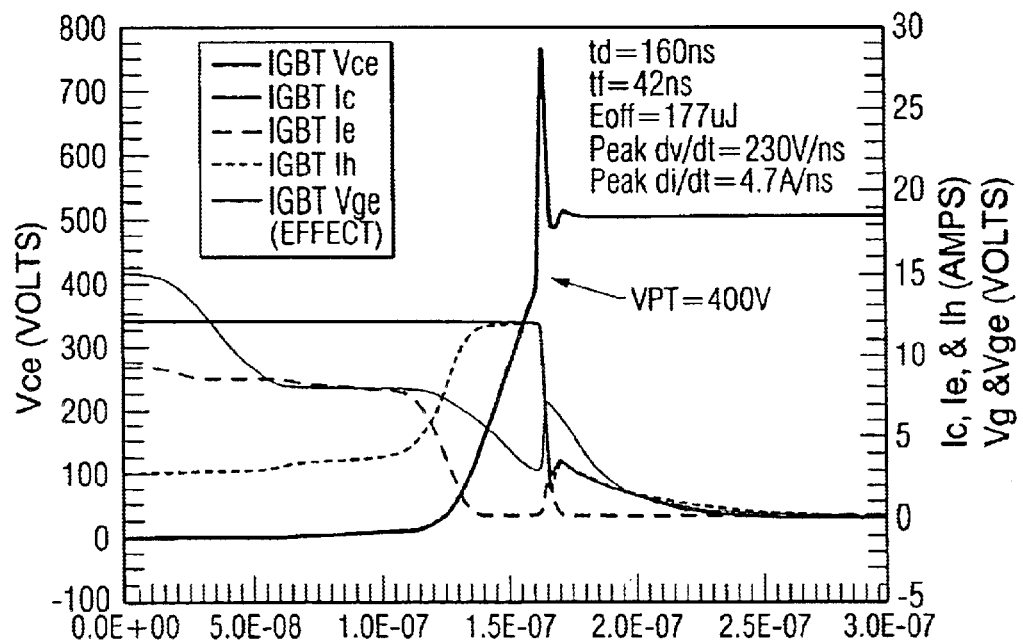
Figure 8C:
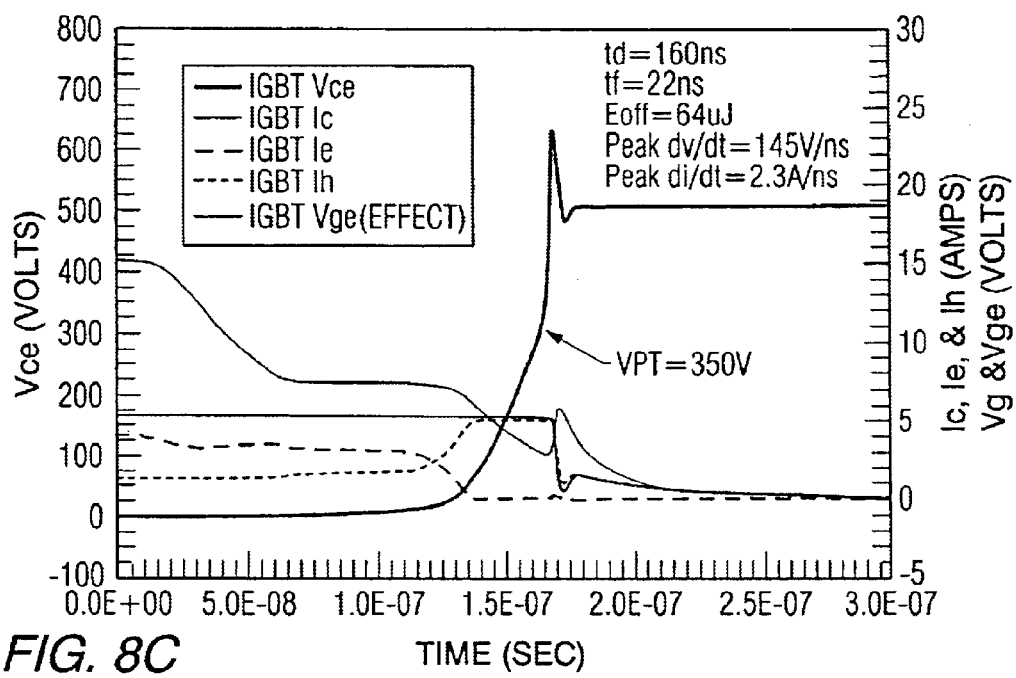

FIGS. 8A, 8B and 8C show the effect of a decreasing switching current density upon a conventional PT IGBT. FIGS. 8A, 8B and 8C show simulated switching waveforms at 200, 120 and 50 A/cm$^2$, respectively, for a conventional 600V PT IGBT having a 0.10 cm$^2$ active area and an on-state voltage drop of 1.7V at a junction temperature of 125EC. Comparing the figures reveals that decreasing the switching current density, which reduces the effective doping in the N drift region, reduces the voltage Vce at which punch through occurs. The punch through voltage for the conventional PT IGBT varies from approximately 350V at a switching current density of 50 A/cm$^2$ (FIG. 8C) to approximately 450V at a switching current density of 200 A/cm$^2$ (FIG. 8A), and Vce exceeds the 600V rated voltage of the PT IGBT. In each case, punch through occurs at a Vce of greater than half the PT IGBT rated voltage. Such a relatively high punch though voltage, an abrupt change in dv/dt can trigger transients in collector current, collector voltage, and gate voltage that are induced by package and circuit inductive parasitics.

Figure 9A:
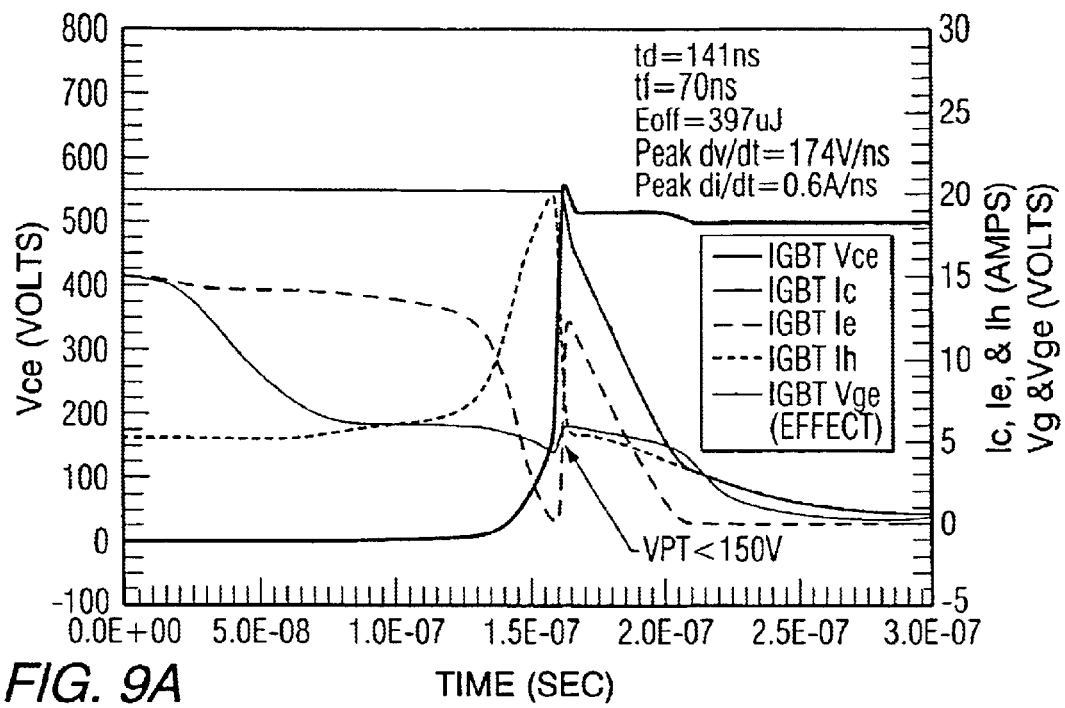
FIGS. 9A, 9B and 9C are simulated switching waveforms for the QPT IGBT of the present invention.
Figure 9B:
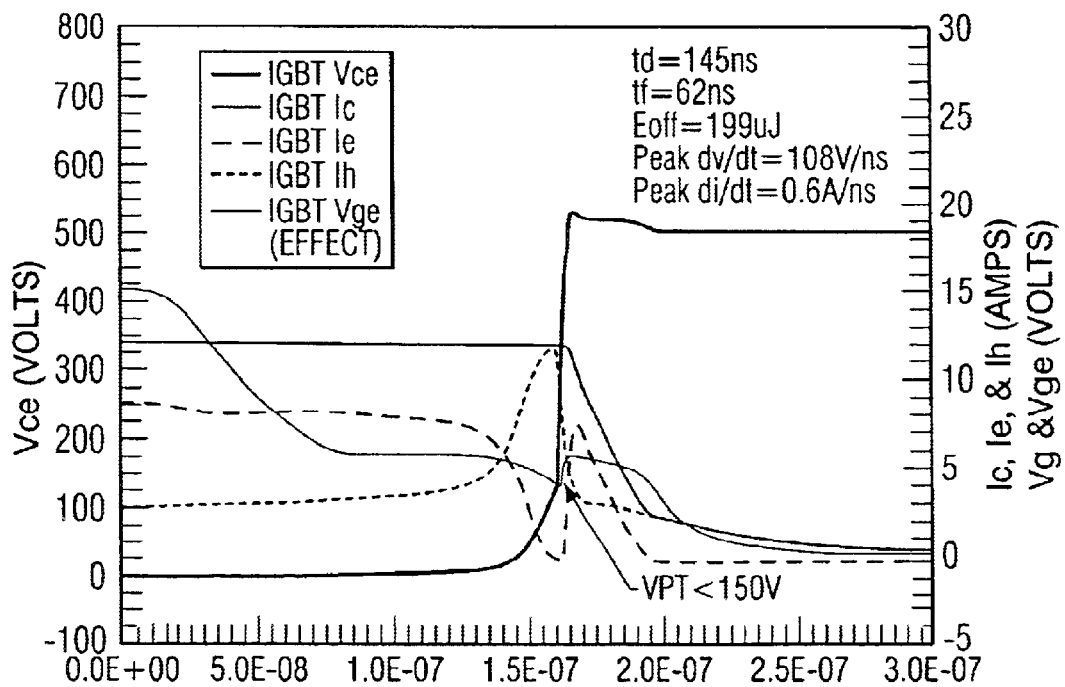
Figure 9C:
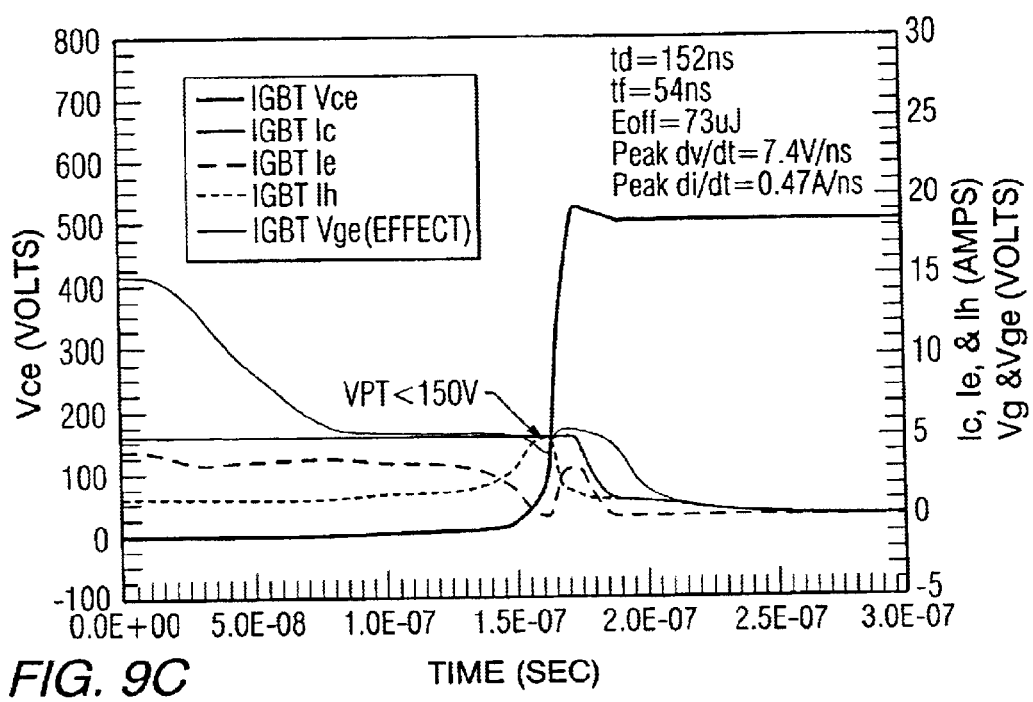

In contrast, FIGS. 9A, 9B and 9C show the effect of a decreasing switching current density upon the QPT IGBT of the present invention. FIGS. 9A, 9B and 9C show simulated switching waveforms at 200, 120 and 50 A/cm$^2$, respectively, for the QPT IGBT having a 0.10 cm$^2$ active area and an on-state voltage drop of 1.7V at a junction temperature of 125EC. Comparing the figures shows that the Vce at which punch through occurs for the QPT IGBT varies by less than approximately 20V for the range of switching current densities shown, and thus punch through remains generally fixed at less than approximately one-third the rated voltage of the QPT IGBT regardless of variation in current density across the range plotted.

Figure 10A:
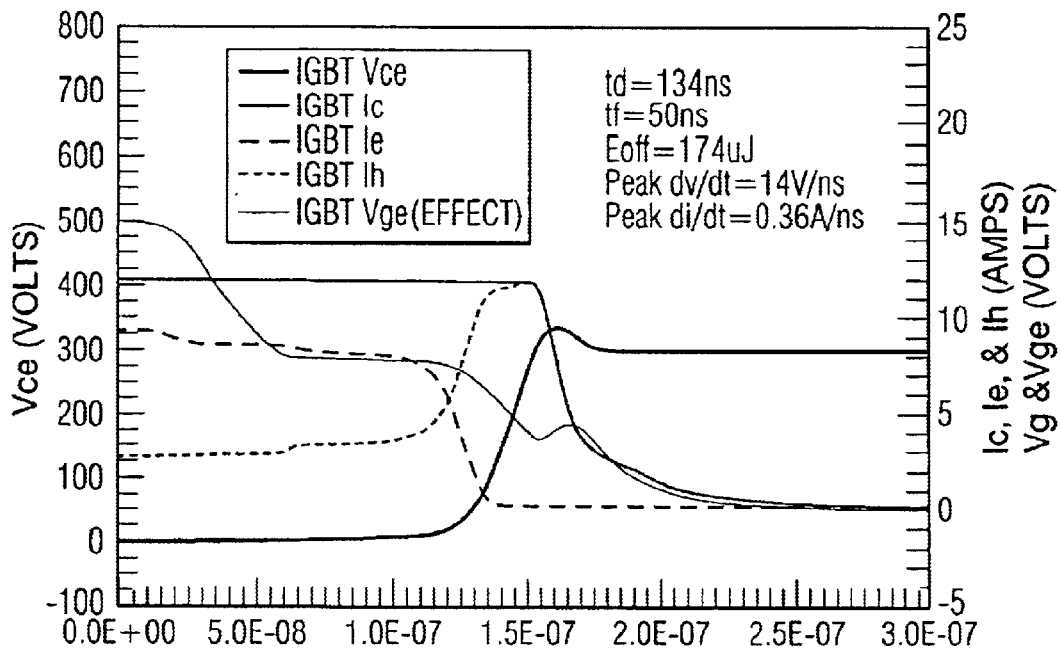
FIGS. 10A, 10B and 10C are simulated switching waveforms for a conventional 600V PT IGBT.
Figure 10B:
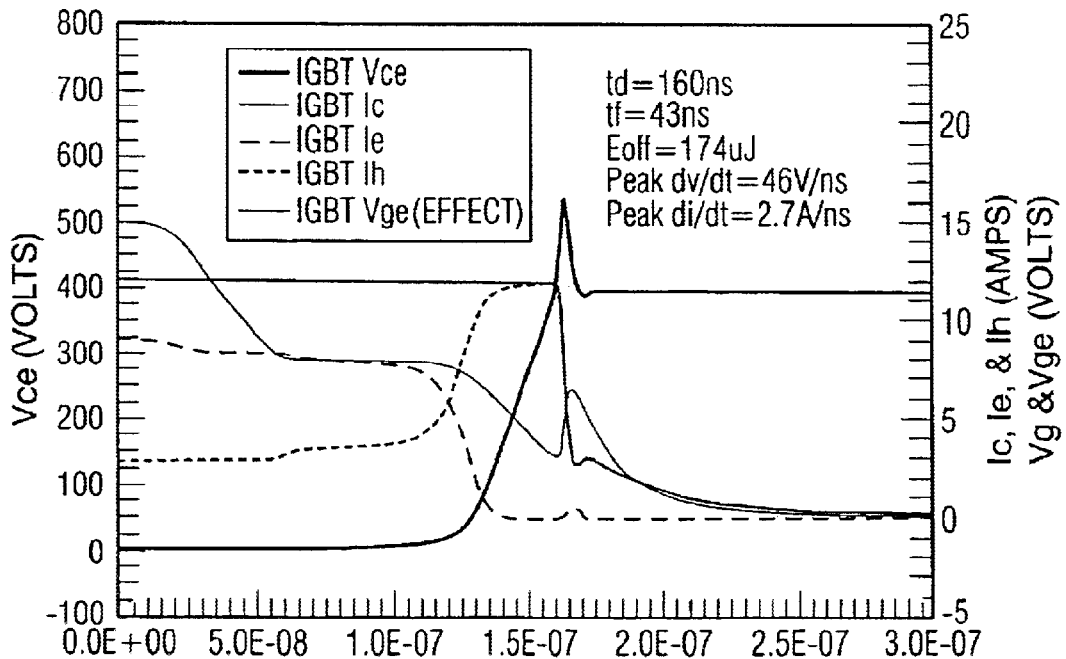
Figure 10C:
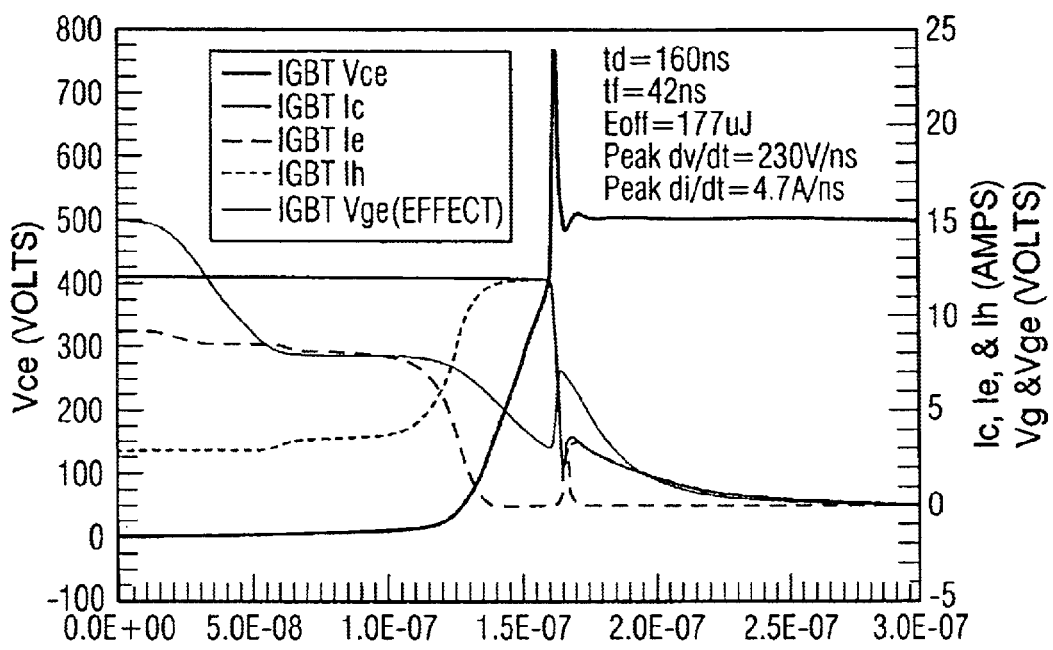

FIGS. 10A, 10B and 10C show the effect of bus voltage Vbus on the switching characteristic of a conventional PT IGBT. FIGS. 10A, 10B and 10C show simulated switching waveforms at Vbus equal to 300, 390 and 500 V, respectively, for a conventional 600V PT IGBT having a 0.10 cm$^2$ active area and an on-state voltage drop of 1.7V at 125EC with a 15V gate at 120 A/cm$^2$. Such a conventional PT IGBT does not punch through to the buffer at bus voltages less than 390V. Below this level of bus voltage, turn off losses increase during the current fall due to the slow decay of minority carriers in the N drift region. Comparing the figures shows that the collector current Ic rate of change di/dt increases as Vbus increases, and the transient or overshoot of Vce when Vbus is equal to 500V (FIG. 10C) exceeds the rated voltage (600V) of the conventional PT IGBT.

Figure 11A:
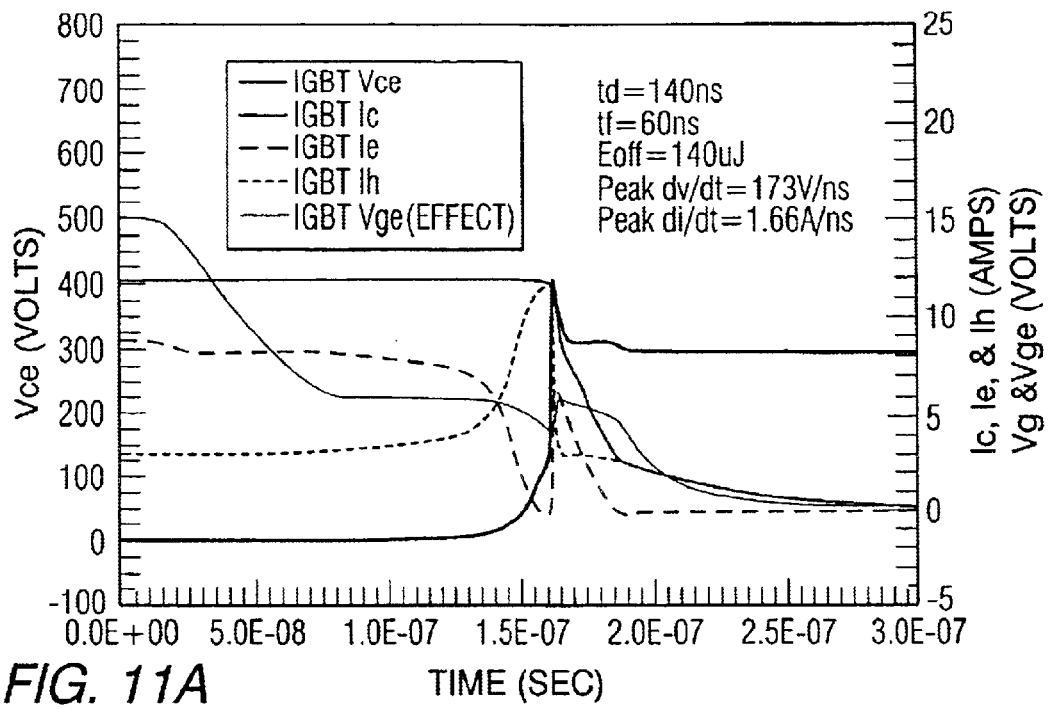
FIGS. 11A, 11B and 11C are simulated switching waveforms for the 600V QPT IGBT of the present invention.
Figure 11B:
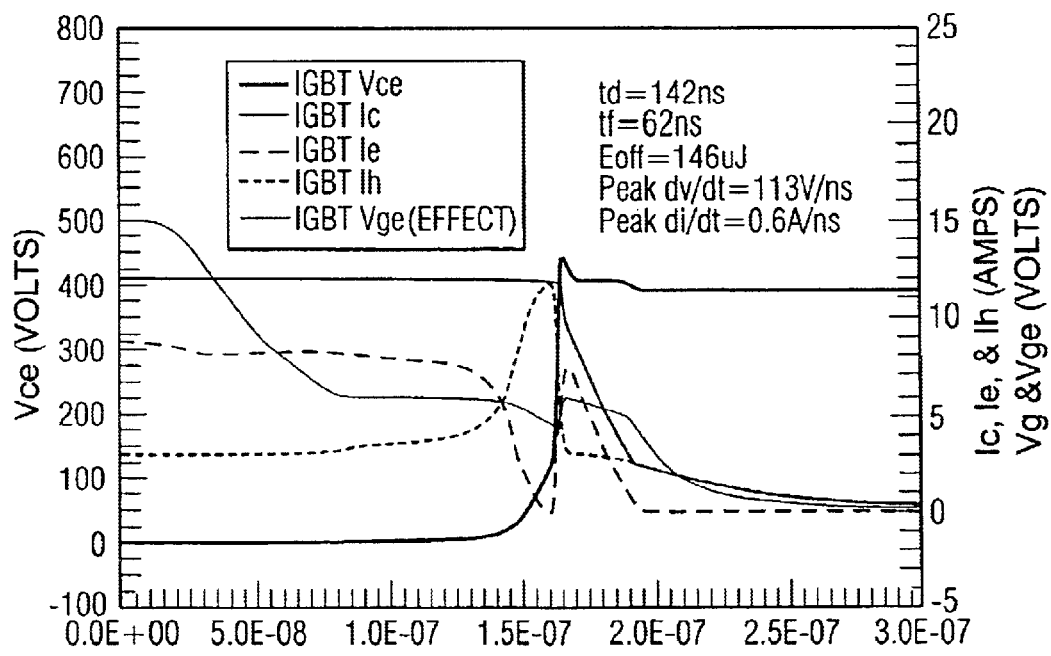
Figure 11C:
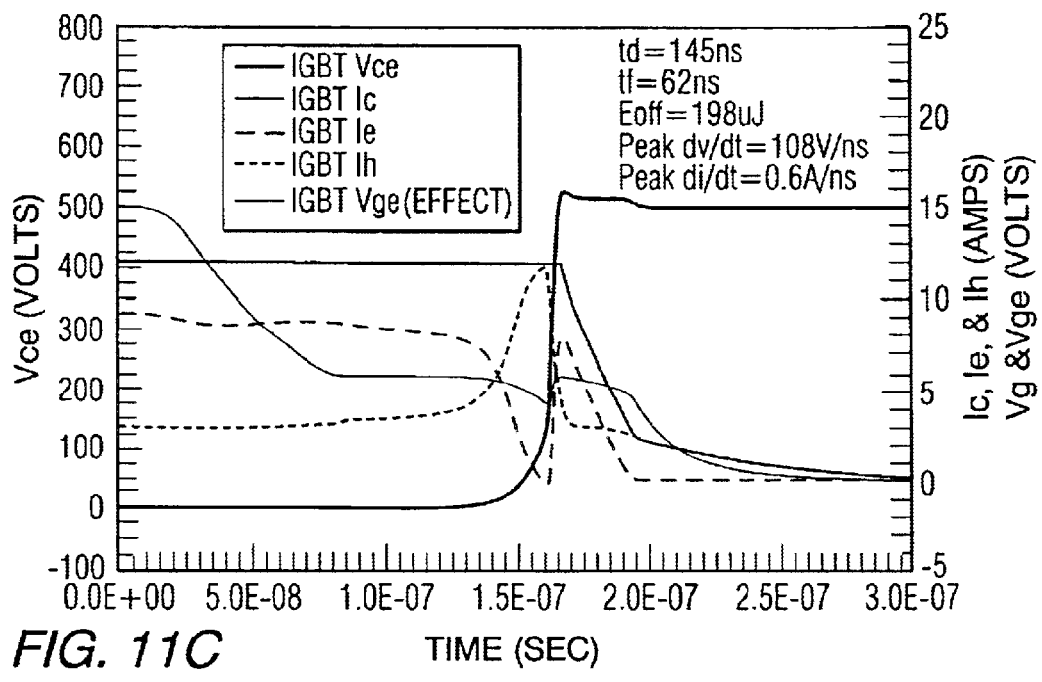

Referring to FIGS. 11A, 11B and 11C simulated switching waveforms with Vbus equal to 300, 390 and 500 V, respectively, are shown for the 600V QPT IGBT of the present invention having a 0.10 cm$^2$ active area and an on-state voltage drop of 1.7V at 125EC with a 15V gate at 120 A/cm$^2$. In contrast to the high punch through voltage of the conventional PT IGBT, the QPT IGBT of the present invention has a punch though voltage of approximately one-third the rated voltage and has lower turn off losses at lower bus voltages. This results from the N drift region being fully depleted at a low value of Vc. The di/dt quickly decreases to a rate controlled by the discharge of the gate. The transient or overshoot of Vce does not exceed the rated voltage (600V) of the QPT IGBT.

Figure 12A:
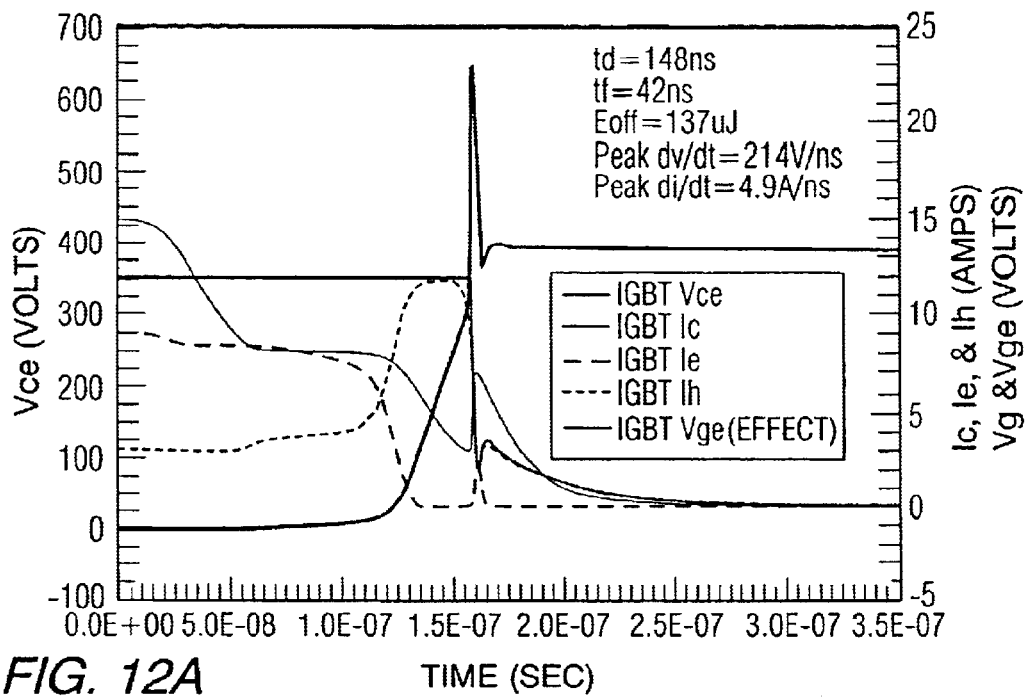
FIGS. 12A, 12B and 12C are simulated switching waveforms for a conventional 600V PT IGBT.
Figure 12B:
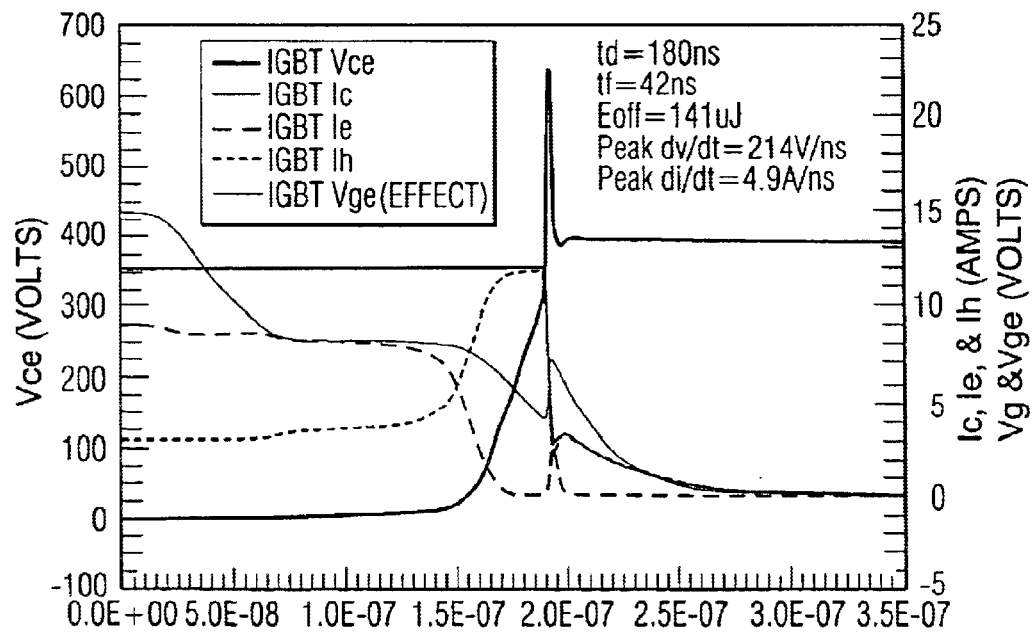
Figure 12C:
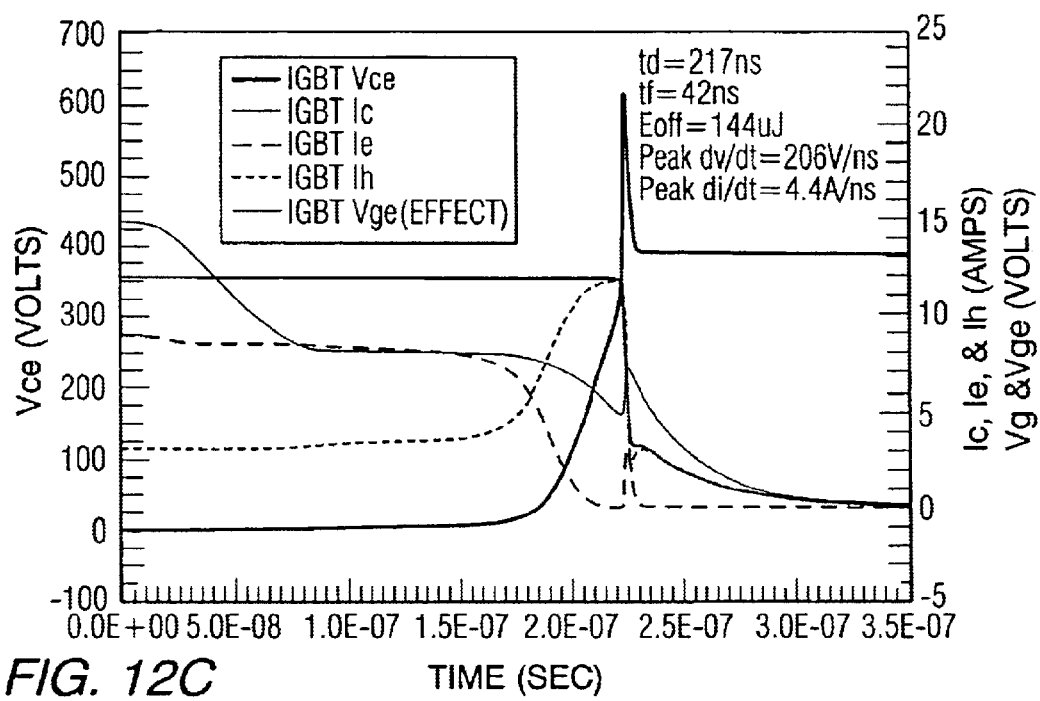

As stated herein, the di/dt of a conventional PT IGBT is not controlled during inductive turn-off. Referring now to FIGS. 12A, 12B and 12C, simulated switching waveforms for a conventional 600V PT IGBT having a 0.10 cm$^2$ active area and an on-state voltage drop of 1.7V at 125EC with a 15V gate supply voltage at 120 A/cm$^2$ are shown for gate resistance Rg values of 15, 20 and 25 ohms, respectively.

Figure 13A:
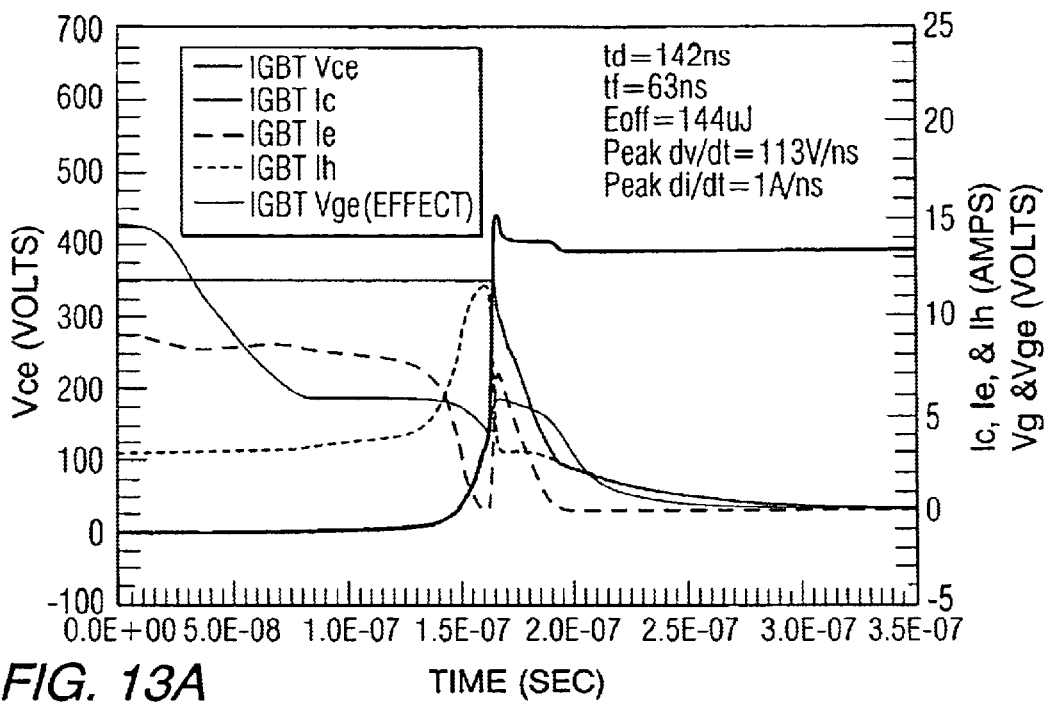
FIGS. 13A, 13B and 13C are simulated switching waveforms for the 600V QPT IGBT of the present invention.
Figure 13B:
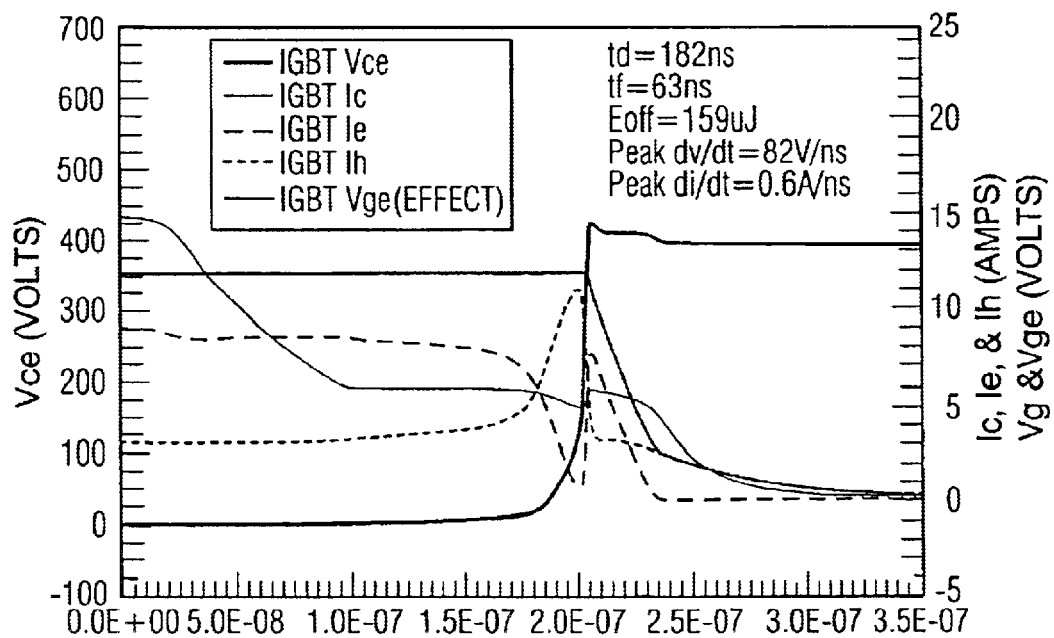
Figure 13C:
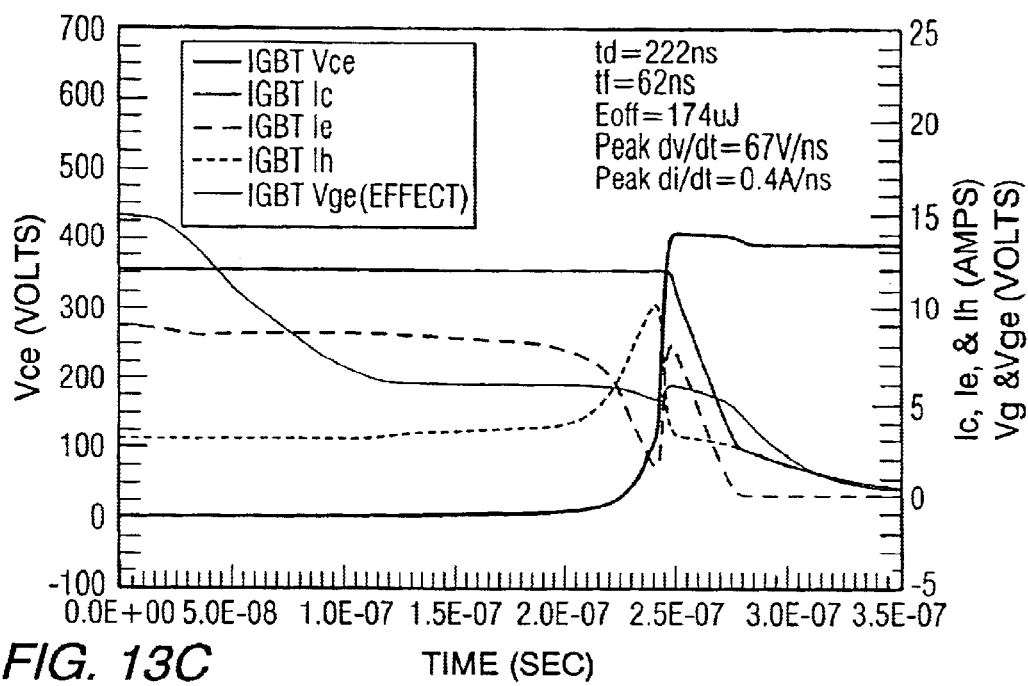

The di/dt of collector current Ic is virtually unaffected by the change in Rg across the range plotted. In contrast, the di/dt of collector current Ic in the QPT IGBT of the present invention is controlled by adjusting Rg. Referring to FIGS. 13A, 13B and 13C simulated switching waveforms for a 600V QPT IGBT having a 0.10 cm² active area and an on-state voltage drop of 1.7V at 125EC with a 15V gate supply voltage at 120 A/cm² for gate resistance Rg values of 15, 20 and 25 ohms, respectively, are shown. The di/dt of collector current Ic varies inversely with Rg, i.e., as Rg increases di/dt decreases. This is due to $Vge_{(EFFECTIVE)}$ being maintained at or above the threshold voltage $V_{TH}$ when Vc equals the bus voltage during the turn-off dv/dt, thereby giving the QPT IGBT time to stabilize at the bus voltage while the device is on in the saturated mode. However, as the di/dt of collector current Ic is decreased by increasing Rg, the turn-off delay time increases thereby increasing turn-off losses. This tradeoff enables a circuit designer to control the tradeoff between EMI (generated by turn-off di/dt) and turn-off losses by selecting a value of Rg that corresponds to the trait most desired in the particular application.

In the embodiment shown, a QPT IGBT of the present invention is configured as a 600V rated IGBT. However, it is to be understood that the QPT IGBT of the present invention can be alternately configured with a rated voltage greater than or less than 600V, such as, for example, 1200V or 300V.

While this invention has been described as having a preferred design, the present invention can be further modified within the spirit and scope of this disclosure. This application is therefore intended to cover any variations, uses, or adaptations of the present invention using the general principles disclosed herein. Further, this application is intended to cover such departures from the present disclosure as come within the known or customary practice in the art to which this invention pertains and which fall within the limits of the appended claims.

What is claimed:

1. A quick punch-through integrated gate bipolar transistor (IGBT), comprising:
    a drift region having a drift region dopant concentration and drift region thickness; and
    a gate having a gate capacitance;
    wherein said drift region dopant concentration, drift region thickness and gate capacitance are adjusted dependent at least in part upon a PNP gain of said IGBT to maintain an effective gate voltage at a level greater than a threshold voltage of the IGBT as the voltage across the IGBT rises toward a bus voltage during turn off of the IGBT.

2. The quick punch through IGBT of claim 1, wherein said drift region dopant concentration is less than approximately $5 \times 10^{14}$ a/cm³.

3. The quick punch through IGBT of claim 1, wherein said IGBT has a rated voltage of at least 600V, and said drift region dopant concentration is from approximately $1 \times 10^{13}$ a/cm³ to approximately $2 \times 10^{14}$ a/cm³.

4. The quick punch through IGBT of claim 1, wherein said IGBT has a rated voltage of 600V or less, and said drift region dopant concentration is from approximately $1 \times 10^{14}$ a/cm³ to approximately $5 \times 10^{14}$ a/cm³.

5. The quick punch through IGBT of claim 1, wherein said drift region thickness is less than 90 micrometers (μm).

6. The quick punch through IGBT of claim 1, wherein said IGBT has a rated voltage of 600V or less, and said drift region thickness is from approximately 20 to approximately 45 μm.

7. The quick punch through IGBT of claim 1, wherein said IGBT has a rated voltage of at least 600V, and said drift region thickness is from approximately 45 to approximately 90 μm.

8. The quick punch through IGBT of claim 1, wherein said gate capacitance is greater than 0.3 nano-Farad (nFd).

9. The quick punch through IGBT of claim 1, wherein said gate capacitance is from approximately 0.3 nFd to approximately 8 nFd.

10. The quick punch through IGBT of claim 1, wherein said drift region dopant concentration is less than approximately $5 \times 10^{14}$ a/cm³, said drift region thickness being less than 90 μm.

11. The quick punch through IGBT of claim 1, wherein said IGBT has a rated voltage equal to or greater than 600V, said drift region dopant concentration is from approximately $10^{13}$ a/cm³ to approximately $2 \times 10^{14}$ a/cm³, and said drift region thickness is from approximately 45 to approximately 90 μm.

12. The quick punch through IGBT of claim 1, wherein said IGBT has a rated voltage equal to or less than 600V, said drift region dopant concentration is from approximately $10^{14}$ a/cm³ to approximately $5 \times 10^{14}$ a/cm³, and said drift region thickness is from approximately 20 to approximately 45 μm.

13. The quick punch through IGBT of claim 1, wherein said drift region dopant concentration is less than approximately $5 \times 10^{14}$ a/cm³, and said gate capacitance is from approximately 0.4 nFd to approximately 8 nFd.

14. The quick punch through IGBT of claim 1, wherein said drift region dopant concentration is less than approximately $5 \times 10^{14}$ a/cm³, said drift region thickness is less than 90 μm, and said gate capacitance is greater than 0.4 nFd.

15. A method of making a quick punch through IGBT, comprising:
    doping the drift region with a drift region dopant concentration, said drift region dopant concentration being reduced relative to the drift region dopant concentration of a conventional punch through IGBT;
    fabricating a drift region having a drift region thickness, said drift region thickness being reduced relative to a conventional punch through IGBT; and
    adjusting the capacitance of the gate; wherein
    said doping, fabricating and adjusting steps maintain the effective gate voltage at a level greater than the IGBT threshold voltage as a voltage across the IGBT rises toward a bus voltage during turn off of the IGBT.

16. The method of claim 15, wherein said adjusting step comprises changing at least one of a thickness of the gate insulation material and a width of the gate.

17. The method of claim 15, wherein said doping step comprises doping the drift region with a drift region dopant concentration is less than $5 \times 10^{14}$ a/cm³.

18. The method of claim 15, wherein said fabricating step comprises fabricating a drift region having a drift region thickness less than 90 μm.

19. The method of claim 15, wherein said adjusting step comprises adjusting the capacitance of the gate is greater than approximately 0.4 nFd.

20. A method of making a quick punch through IGBT, comprising the step of:
    maintaining the effective gate voltage above the threshold voltage of the IGBT when the depletion layer punches through to the buffer as the voltage across the IGBT rises toward a bus voltage during turn-off of the IGBT, thereby ensuring that the hole carrier concentration remains equal to or greater than said drift region dopant concentration at the punch through voltage.

21. The method of claim 20, wherein said maintaining step comprises at least one of:

doping the drift region with a drift region dopant concentration, said drift region dopant concentration being reduced relative to the drift region dopant concentration of an equivalent-rated conventional punch through IGBT;

fabricating a drift region having a drift region thickness, said drift region thickness being reduced relative to an equivalent-rated conventional punch through IGBT; and adjusting the capacitance of the gate.

22. The method of claim 21, wherein said adjusting step comprises changing at least one of a thickness of the gate insulation material and a width of the gate.

23. The method of claim 21, wherein said doping step comprises doping the drift region with a drift region dopant concentration of less than approximately $5 \times 10^{14}$ a/cm$^3$.

24. The method of claim 21, wherein said fabricating step comprises fabricating a drift region having a drift region thickness of less than approximately 90 μm.

25. The method of claim 21, wherein said adjusting step comprises adjusting the capacitance of the gate to be greater than 0.4 nFd.

26. A quick punch-through integrated gate bipolar transistor (IGBT), comprising:

a drift region having a drift region dopant concentration and drift region thickness; and a gate having a gate capacitance;

wherein said drift region dopant concentration, drift region thickness and gate capacitance are adjusted dependent at least in part upon a PNP gain of said IGBT to thereby control a peak rate of change of the collector current fall during turn off of the IGBT.

* * * * *